(12) United States Patent
Varnica et al.

(10) Patent No.: US 8,219,878 B1
(45) Date of Patent: Jul. 10, 2012

(54) POST-PROCESSING DECODER OF LDPC CODES FOR IMPROVED ERROR FLOORS

(75) Inventors: Nedeljko Varnica, Sunnyvale, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 867 days.

(21) Appl. No.: 12/327,627

(22) Filed: Dec. 3, 2008

Related U.S. Application Data

(60) Provisional application No. 60/991,905, filed on Dec. 3, 2007.

(51) Int. Cl.
  *G06F 11/00* (2006.01)
(52) U.S. Cl. ........................ 714/758; 714/780
(58) Field of Classification Search .................. 714/758, 714/780
  See application file for complete search history.

(56) References Cited

U.S. PATENT DOCUMENTS

| | | | |
|---|---|---|---|
| 7,191,378 B2 * | 3/2007 | Eroz et al. | 714/758 |
| 7,373,585 B2 * | 5/2008 | Yedidia et al. | 714/786 |
| 7,500,172 B2 * | 3/2009 | Shen et al. | 714/780 |
| 2002/0010892 A1 * | 1/2002 | Lodge et al. | 714/777 |
| 2005/0193320 A1 * | 9/2005 | Varnica et al. | 714/800 |
| 2007/0234184 A1 * | 10/2007 | Richardson | 714/780 |
| 2008/0126908 A1 * | 5/2008 | Lin | 714/758 |
| 2008/0235559 A1 * | 9/2008 | Yang | 714/758 |
| 2008/0244360 A1 * | 10/2008 | Mokhlesi et al. | 714/758 |
| 2008/0301517 A1 * | 12/2008 | Zhong | 714/752 |
| 2009/0313525 A1 * | 12/2009 | Savin et al. | 714/752 |
| 2010/0042904 A1 * | 2/2010 | Gunnam | 714/780 |
| 2010/0042905 A1 * | 2/2010 | Gunnam et al. | 714/780 |
| 2011/0078548 A1 * | 3/2011 | Xin | 714/807 |

OTHER PUBLICATIONS

Han, Yang and William E Ryan, LDPC Decoder Strategies for Achieving Low Error Floors, 2008, Department of Electrical and Computer Engineering—University of Arizona, pp. 1-10.*

* cited by examiner

*Primary Examiner* — Marc Duncan

(57) ABSTRACT

Systems and methods are provided for decoding received codewords using an LDPC code. An LDPC post-processor is disclosed for performing post-processing when standard LDPC decoding fails due to a trapping set. The LDPC post-processor may direct the LDPC decoder to decode the received codeword again, but may change some of the inputs to the LDPC decoder so that the LDPC decoder does not fail in the same way. In one embodiment, the LDPC post-processor may modify the symbol positions in the received codeword that correspond to a particular unsatisfied check. In another embodiment, the LDPC post-processor may modify the messages in the decoder's iterative message algorithm that correspond to the symbol positions.

29 Claims, 13 Drawing Sheets

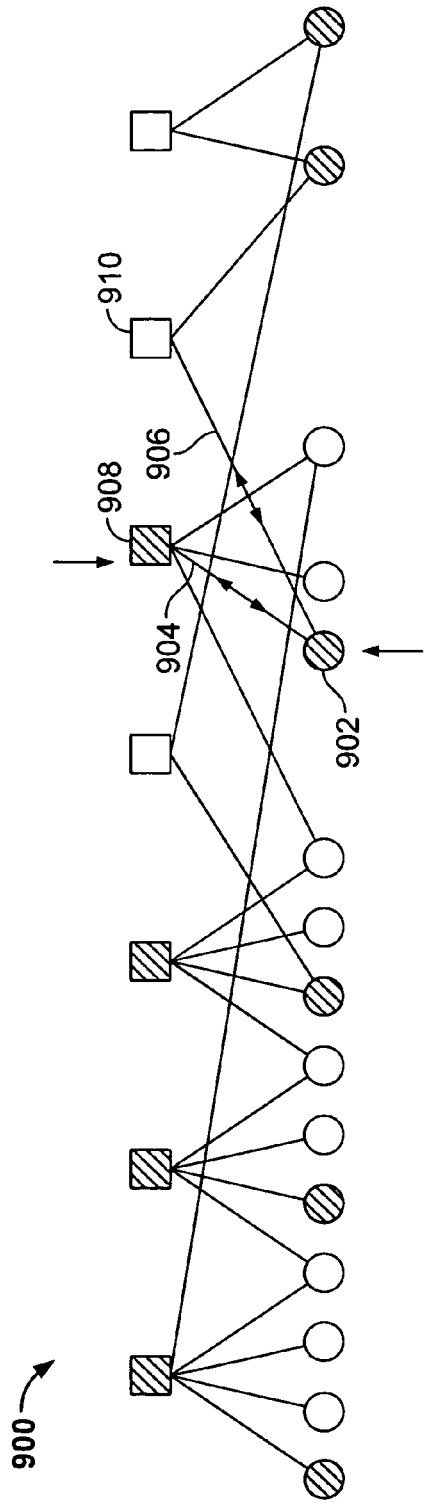
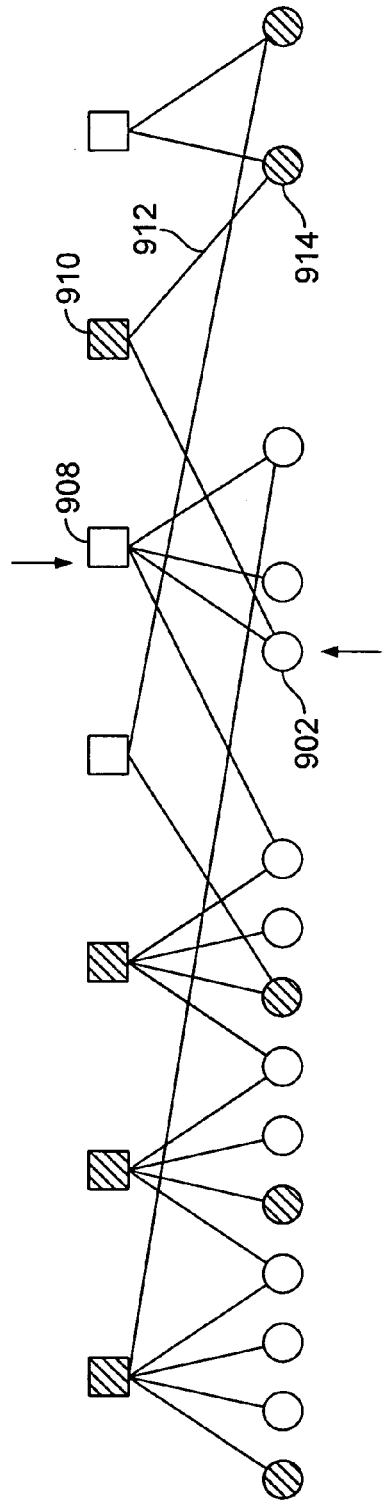
FIG. 9A
FIG. 9B

POST-PROCESSING DECODER OF LDPC CODES FOR IMPROVED ERROR FLOORS

CROSS-REFERENCE TO RELATED APPLICATIONS

This claims the benefit under 35 U.S.C. §119(e) of U.S. Provisional Application No. 60/991,905 filed Dec. 3, 2007, which is hereby incorporated by reference herein in its entirety.

BACKGROUND OF THE DISCLOSURE

The disclosed technology relates generally to decoding data, and more particularly to decoding low-density parity check (LDPC) codes.

With the continuing demand for high-reliability transmission of information in digital communication and storage systems, and with the rapid increase in available computational power, various coding and decoding techniques have been investigated and applied to increase the performance of these systems. One such coding technique, LDPC coding, was first proposed in the 1960s, but was not used until the late 1990s when researchers began to investigate iterative coding and decoding techniques.

LDPC codes are among the few known error control coding techniques capable of transmitting information at a rate close to the Shannon limit (also known as channel capacity). LDPC codes can be regular or irregular, have a linear or cyclic encoding matrix, and can be decoded in a myriad of ways, ranging in complexity and error performance.

However, there are a few concerns with LDPC codes. The error floor of LDPC codes may be of particular concern. In many applications, low error floors are required to enable applications to perform with high reliability (e.g., low bit or sector error rate). However, depending on the LDPC code, there may be certain combinations of failures (referred to as trapping sets or near codeword failures) that prevent applications from achieving a low error floor.

SUMMARY OF THE DISCLOSURE

Accordingly, systems, methods, and apparatus are provided for post-processing a received codeword after standard decoding produces a codeword with a trapping set or near-codeword.

In some embodiments, a decoding system may be used to interpret a noisy signal received from a channel (e.g., a magnetic recording channel or other communications or storage channel). The decoding system may include a channel detector, an LDPC decoder, and an LDPC post-processor. The channel detector may generate a received codeword from the noisy signal. The received codeword may be in the form of, for example, a log-likelihood ratio (LLR) for each bit or symbol. The LDPC decoder may obtain the received codeword as input from the channel detector, and may perform decoding on the received codeword. In some embodiments, the LDPC decoder may be configured to perform an iterative message passing algorithm. This algorithm may involve performing a plurality of check node updates and bit node updates, where updated check nodes pass messages to update bit nodes, and vice versa. The messages may also be in the form of LLRs or another soft-information metric.

In some scenarios, even after a large number of iterations, the LDPC decoder may not produce an output that converges to a valid LDPC codeword. This may occur, for example, when the check node messages reinforce erroneous bit or symbol values at each iteration rather than correcting the erroneous bit or symbol values. In some instances, the LDPC decoder is unable to produce a valid LDPC codeword because a trapping set is present in the resulting codeword (the resulting codeword may be referred to as a "tentative codeword"). After producing a tentative codeword with a trapping set, the LDPC decoder may run additional iterations of the message passing algorithm to attempt to generate a valid codeword. To prevent the LDPC decoder from producing an output that converges to the same trapping set, the decoding system includes an LDPC post-processor.

An LDPC post-processor configured in accordance with the present invention may be configured to change some of the inputs to the LDPC decoder. In some embodiments, the LDPC post-processor may change some of the inputs that would otherwise have been provided by the channel detector. This technique effectively modifies the received codeword and allows the LDPC decoder to decode the modified received codeword. To determine which symbol positions of the received codeword to change, the LDPC post-processor may select one of the unsatisfied checks associated with the tentative codeword, and may then identify the symbol positions in the received codeword associated with the unsatisfied check. These symbol positions may be the ones that the LDPC post-processor changes.

To change the inputs to the LDPC decoder corresponding to the identified symbol positions, the LDPC post-processor may set the inputs to predetermined values. In some embodiments, the predetermined values may each be one of two values. The predetermined value may, for example, be a predetermined magnitude (e.g., a maximal magnitude) having either a positive or negative sign. The LDPC post-processor may then set one of the symbol positions to a sign that is opposite of the sign in the tentative codeword (for the corresponding symbol position). The LDPC post-processor may set the sign for the remaining symbol positions to a sign that is the same as that in the tentative codeword (for the corresponding symbol positions). By setting one symbol position to an opposite value, the LDPC post-processor essentially operates with the assumption that this symbol position was erroneous, and attempts to correct the error.

With the inputs to the LDPC decoder modified in this manner, the LDPC decoder may be directed to decode this modified received codeword, which may in some cases produce a valid codeword (depending, for example, on whether the symbol position assigned an opposite sign was actually one of the erroneous symbols). In some embodiments, the LDPC decoder may be re-initialized prior to decoding the modified received codeword. In other embodiments, the LDPC decoder may use the messages produced from decoding the received codeword (without modification) as the initial messages in the message passing algorithm.

The LDPC post-processor may direct the LDPC decoder to perform decoding several additional times, each time with a different symbol position set to an opposite sign and/or by modifying the symbol positions associated with a different unsatisfied check.

In other embodiments of the present invention, instead of modifying the symbol inputs to the LDPC decoder, the LDPC post-processor may change the messages passed in the message passing algorithm of the LDPC decoder. In these embodiments, the LDPC post-processor may identify symbol positions in the same or similar manner as described above. However, instead of changing the symbol inputs, the LDPC post-processor may change the value of the messages associated with the identified symbol positions. For example, the LDPC post-processor may fix (or "freeze") the messages associated with one of the symbol positions to a predetermined (e.g., maximal) magnitude and a sign opposite of that of the tentative codeword (for the corresponding symbol position). The LDPC post-processor may freeze the messages associated with the other symbols positions to a predetermined (e.g., maximal) magnitude and a sign that is the same as that from the tentative codeword (for the corresponding symbol positions).

In some embodiments, an apparatus may be used to decode a received codeword. The apparatus may perform standard decoding on the received codeword based on a LDPC code. The apparatus may then select an unsatisfied check from a set of checks, and the apparatus may identify a set of symbol positions in the received codeword associated with the unsatisfied check. The apparatus may further modify the received codeword by setting the set of identified symbol positions of the received codeword to predetermined values. The apparatus may then decode the modified received codeword based on the LDPC code.

In some embodiments, an apparatus for decoding a received codeword using an LDPC code may perform iterations of an iterative decoding algorithm on a received codeword. The apparatus may generate a plurality of messages at each iteration to be used in a next iteration and the apparatus may produce one or more checks at each iteration. The apparatus may select a unsatisfied check from the generated checks and identify a set of symbol positions in the received codeword associated with the unsatisfied check. The apparatus may then perform one or more additional iterations of the iterative decoding algorithm on the received codeword, and fix messages that are associated with the set of identified symbol positions to predetermined values in each of the additional iterations.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIGS. 9A-9C are graphical representations of overlapping trapping sets;

DETAILED DESCRIPTION OF THE DISCLOSURE

The disclosed technology is directed toward systems, methods; and apparatus for LDPC decoding and LDPC post-processing that lead to advantageously lowered error floors. In applications or devices where information May be altered by interference signals or other phenomena, error-correction codes, such as LDPC codes, can provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
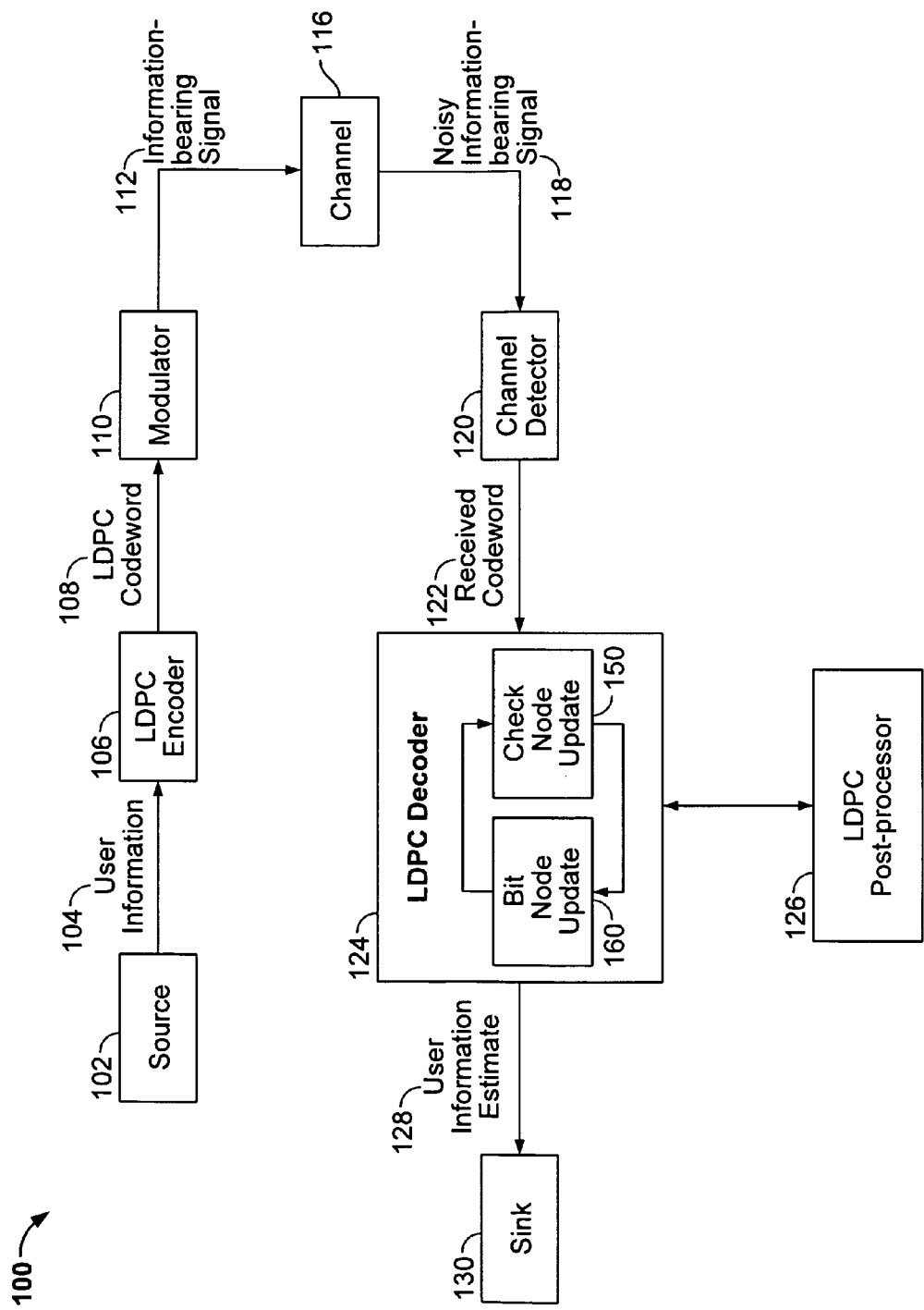
FIG. 1 is a simplified block diagram of an illustrative data communications or storage system.

FIG. 1 is a simplified block diagram of illustrative data communications or storage system 100. System 100 can include source 102, LDPC encoder 106, modulator 110, channel 116, channel detector 120, LDPC decoder 124, LDPC post-processor 126, and sink 130. System 100 may be used to transmit user information 104 from source 102 to sink 130 through channel 116, or used to store user information 104 from source 102 in channel 116 which is eventually retrieved and provided to sink 130.

Channel 116 may be any suitable wired or wireless communications medium/media or may be any suitable storage medium/media. For example, in some embodiments, channel 116 may be a magnetic (e.g., hard disk), an electrical (e.g., random access memory (RAM) or FLASH), or an optical (e.g., CD-ROM) storage medium. Channel 116 may be referred to as a magnetic recording channel in embodiments where channel 116, is a magnetic storage medium.

LDPC encoder 108 and modulator 110 may prepare user information 104 for transmission through or storage in channel 116. LDPC encoder 106 may encode user information 104 to produce LDPC codeword 108. LDPC codeword 108 may be a valid LDPC codeword. A valid LDPC codeword hereinafter refers to a set of bits or symbols that satisfies the coding constraints of the LDPC code employed by LDPC encoder 106. While LDPC codeword 108 may be grouped into symbols of multiple bits and processed in symbols, for simplicity, the various embodiments of the present invention be described in terms of bits and bit processing. LDPC encoder 106 may use any suitable LDPC code to produce LDPC codeword 108. The LDPC code employed by LDPC encoder 106 may be selected to achieve a particular communication or storage performance (e.g., bit or sector error rate). In some embodiments, LDPC encoder 106 may employ a quasi-cyclic LDPC (QC-LDPC) code. In these embodiments, the corresponding QC-LDPC parity check matrix may have a structure that advantageously allows LDPC encoder 106 to store and process the parity check matrix without a large memory and processing requirement, respectively.

Modulator 110 may convert LDPC codeword 108 into information-bearing signal 112, which is suitable for transmission through or storage in channel 116. Modulator 110 may use any of a variety of modulation schemes, such as pulse amplitude modulation (PAM), quadrature amplitude modulation (QAM), phase shift keying (PSK), or orthogonal frequency division multiplexing (OFDM).

Channel 116 may alter, distort, or degrade the information-bearing signal 112, and the resulting signal received or retrieved from channel 116 may be substantially different from information-bearing signal 112. For example, for magnetic recording channels, the resulting signal (referred to in FIG. 1 as noisy information-bearing signal 118) may suffer from effects such as transition jitter and intersymbol interference (ISI). Therefore, system 100 includes LDPC encoder 106, LDPC decoder 124, and LDPC post-processor 126, to accurately interpret noisy information-bearing signal 118. For simplicity, these elements may collectively be referred to as a decoding system.

Channel detector 120 may demodulate noisy information-bearing signal 118 to produce received codeword 122. Channel detector 120 may use any suitable detection algorithm, such as a maximum-likelihood detection algorithm (e.g., a Viterbi algorithm). Received codeword 122 may or may not include soft-information for each bit position. LDPC decoder 124 may decode received codeword 122 using the same LDPC code employed by LDPC encoder 106. Although received codeword 122 may not be a valid codeword, LDPC decoder 124 may still be able to reproduce user information 104 as estimate 128 if, for example, there are sufficiently few errors in received codeword 122.

LDPC decoder 124 may include check node update module 150 and bit node update module 160. Using these update modules, LDPC decoder 124 may perform iterative decoding to process received codeword 122. Examples of such algorithms include min-sum and sum-product iterative message passing algorithms. Using this algorithm, check node update module 150 may first compute a plurality of messages and a plurality of parity checks (parity checks are collectively referred to as a syndrome) for received codeword 122 using the parity check matrix of the LDPC code. Each check, which is associated with a set of symbols in received codeword 122, may be satisfied or unsatisfied—an unsatisfied check indicates that there is at least one associated symbol in received codeword 122 that is erroneous. Check node update module 150 may then pass the check node messages to bit node update module 160, which updates (or performs correction on) the values of received codeword 122 using the check node messages and the original values of the received codeword 122 itself. Bit node update module 160 may then produce and pass the updated bit messages to check node update module 150, allowing check node update 150 to re-compute or update the values of the checks.

In this manner, check node update 150 and bit node update 160 may perform a plurality of iterations, where in each iteration bit node update module 160 may come closer to producing a valid codeword. The check node and bit node update modules of LDPC decoder 124 may compute any suitable number of iterations to update the checks and bits. For example, LDPC decoder 124 may be configured to compute a predetermined number of iterations and/or terminate after reaching a particular condition (e.g., converging to a valid or invalid codeword). The resulting bits produced by bit node update module 160 after LDPC decoder 124 terminates may be referred to collectively as a tentative codeword. For simplicity, the number of iterations used to produce the tentative codeword may be referred to by the variable, n_iter.

Check node update module 150 and bit node update module 160 may compute their respective messages using soft-information. The soft-information may indicate the likely values of the checks or bits, as well as the reliability/likelihood of each value. In some embodiments, LDPC decoder 124 may calculate the soft-information in the form of a LLR for each check or bit. LDPC decoder 124 may, for example, calculate LLRs for each transmitted or stored bit, $b_i$, according to $$LLR(b_i) = \log\left(\frac{P(b_i = 0)}{P(b_i = 1)}\right). \quad (EQ. 1)$$

Thus, using LLRs computed with EQ. 1, the sign of the LLR indicates whether the transmitted or stored bit is more likely a zero or more likely a one. Specifically, a negative LLR indicates a more likely one and a positive LLR indicates a more likely zero. The magnitude of the LLR indicates the strength or confidence of the decoding, where a larger magnitude indicates higher confidence. While check node and bit node update modules (and other blocks described below) will hereinafter be described as producing LLRs, it should be understood that these modules may produce soft-information in any other form (e.g., weighted LLRs).

While checks/check nodes may sometimes be referred to as being "unsatisfied" or "satisfied," it should be understood that these check nodes may, in an advantageous embodiment, be associated with soft-information that indicates how likely it is that the check nodes are satisfied or unsatisfied. Similarly, while bit nodes may sometimes be referred to as being "correct" or "erroneous," it should be understood that these bit nodes may, in an advantageous embodiment, be associated with soft-information that indicates how likely it is that the bit nodes are correct or erroneous.

In some embodiments, LDPC decoder 124 may not be able to produce a valid tentative codeword. This may occur in situations where, for example, the erroneous bits are located in bit positions of received codeword 122 that cause the checks to reinforce, rather than correct, errors. For example, errors may remain even after LDPC decoder 124 performs n_iter iterations when the number of erroneous bits in received codeword 122 results in relatively few unsatisfied checks. A set of erroneous symbols for which there are few unsatisfied checks (such that the set is generally uncorrectable even after many iterations) may be referred to as a "near-codeword" or a "trapping set."

Figure 3:
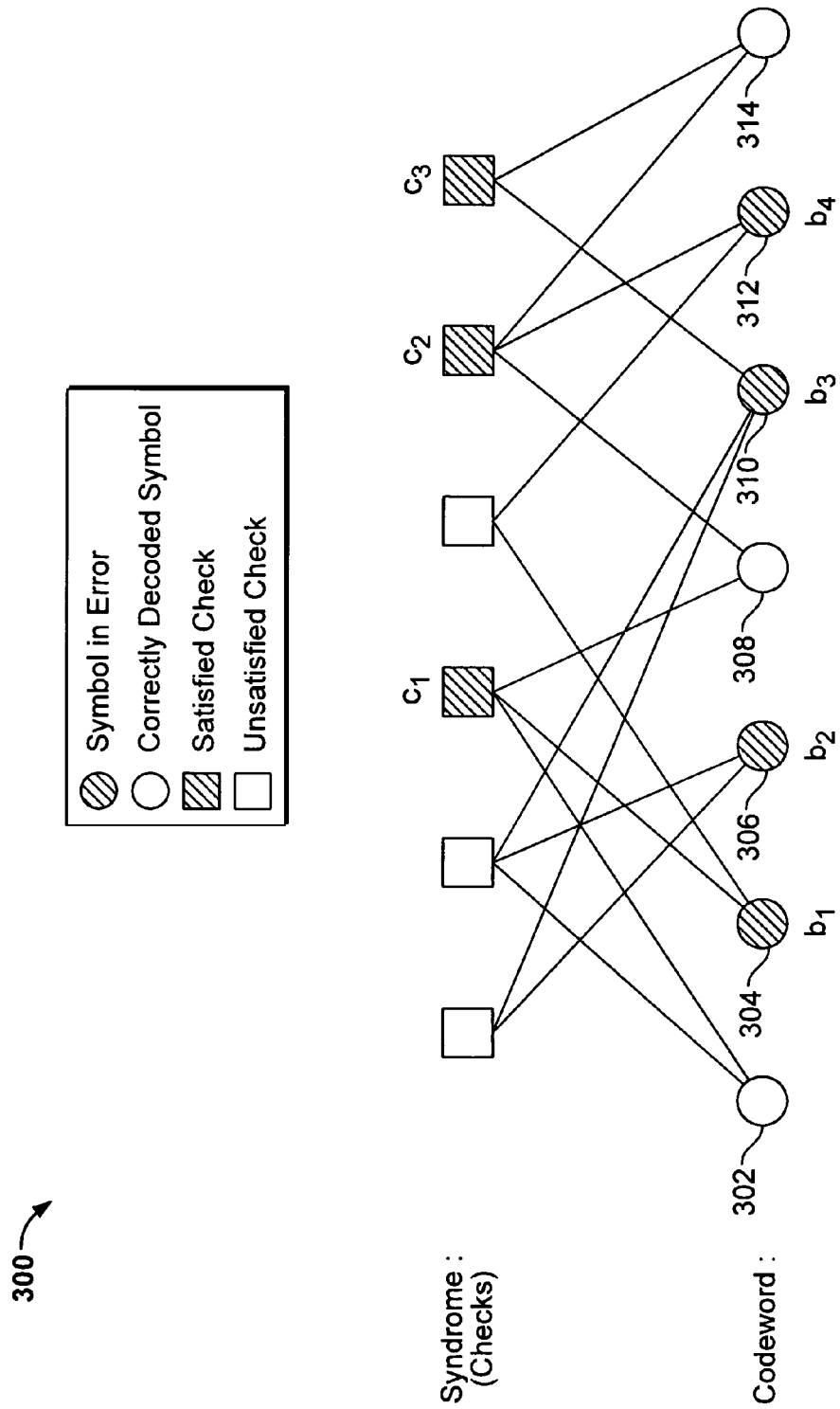
FIG. 3 is a graphical representation of a near-codeword.

Referring briefly to FIG. 3, a graphical representation of illustrative trapping set 300 is shown. This graphical representation is commonly referred to as a Tanner graph, where the squares represent checks (and are referred to sometimes as check nodes), the circles represent the bits of a codeword (and are referred to sometimes as bit nodes), and the lines (or "edges") connecting the squares and circles indicate associations between check nodes and bit nodes. That is, the edges indicate which checks are being used by bit node update module 160 (FIG. 1) to update the LLR for each bit node, as well as which bits are used by check node update module 150 (FIG. 1) to update the LLR for each check node. The LLRs passed between check node and bit node update modules may therefore be referred to sometimes as "edge" LLRs.

Trapping set 300 of FIG. 3 may include four erroneous symbols: $b_1, \ldots, b_4$. These erroneous symbols may represent the errors present in a tentative codeword after n_iter initial iterations of the decoding algorithm. Together, the four erroneous symbols are connected to three unsatisfied checks. Trapping set 300 may therefore be referred to as a (4, 3) trapping set. Generally, a (K, s) trapping set may refer to a set of K erroneous symbols, which are collectively associated with a set of checks where s are unsatisfied.

Referring back to FIG. 1, LDPC decoder 124 may in some scenarios produce a tentative codeword with a trapping set (e.g., trapping set 300 of FIG. 3). If LDPC decoder 124 provided user information estimate 128 to sink 130 without further correction, LDPC decoder 124 would provide incorrect information whenever a trapping set is present. Trapping sets may form the error floor of the LDPC code. Having an error floor that is high due to the presence of trapping sets is undesirable, at least because decoding performance can only be marginally improved even for large increases in signal-to-noise ratio (SNR).

Thus, communications and storage system 100 may include LDPC post-processor 126 to aid LDPC decoder 124 in producing a valid codeword. If LDPC decoder 124 produces a valid tentative codeword without the aid of LDPC post-processor 126 and within the n_iter iterations, LDPC decoder 124 may provide to sink 130 the corresponding decoded information as user information estimate 128. Otherwise, LDPC post-processor 126 may change some of the inputs to LDPC decoder 124, and LDPC decoder 124 may run additional iterations with these changed inputs. As will be discussed in greater detail below, the changes made by LDPC post-processor 126 may prevent LDPC decoder 124 from producing an output that converges to the same near-codeword as before. The number of additional iterations performed by LDPC decoder 124 may be referred to by the symbol n_iter_extra, which may or may not be fixed to some predetermined amount.

Figure 2:
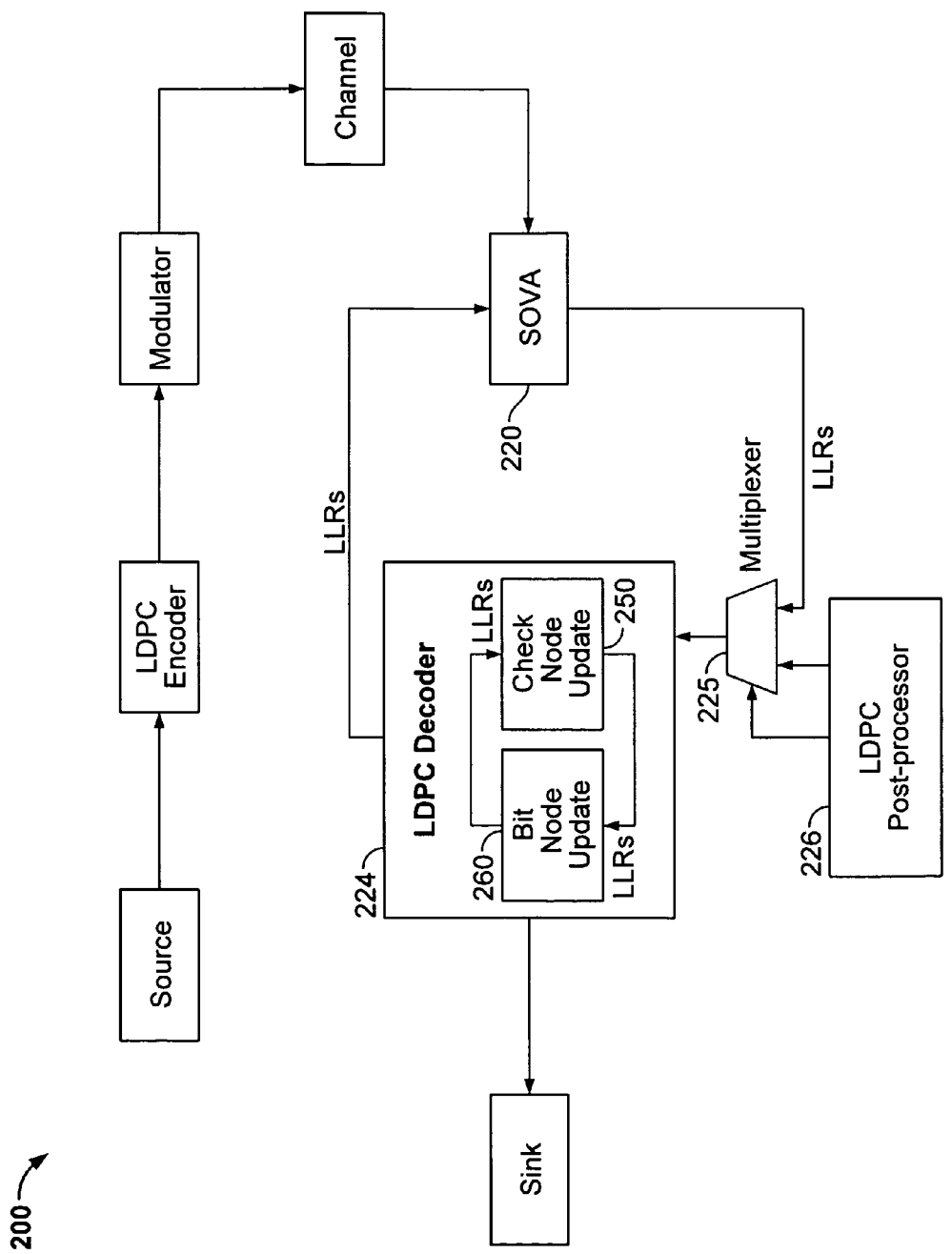
FIG. 2 is a simplified block diagram of an illustrative data communications or storage system having memory.

Referring now to FIG. 2, a simplified block diagram of illustrative communications or storage system 200 is shown. System 200 may have similar features and functionalities as system 100 of FIG. 1. Also, each component of FIG. 2 may have any of the features and functionalities of its corresponding like-named component in FIG. 1. System 200 may be used instead of system 100 in some applications, such as applications in which the channel has memory (e.g., magnetic recording channels or other recording channels).

Communications and storage system 200 includes SOVA 220. SOVA 220 may function as a channel detector, and may use a soft-output Viterbi algorithm to produce soft-information (e.g., LLRs). SOVA 220 and LDPC decoder 224 may be configured to perform a number of iterations. In particular, SOVA 220 may pass LLRs to LDPC decoder 224 to enable LDPC decoder 224 to decode and compute a more reliable set of LLRs. Similarly, LDPC decoder 224 may pass LLRs to SOVA 220 to enable SOVA 220 to generate more reliable channel estimates. Thus, after each iteration between SOVA 220 and LDPC decoder 224, the reliability of the data produced by these modules likely improves.

As described above in connection with FIG. 1, LDPC decoder 224 may include check node update module 250 and bit node update module 260 that iteratively update check and bit nodes, respectively. Thus, interpreting a noisy information-bearing signal in system 200 involves two types of iterations—the iterations between SOVA 220 and LDPC decoder 224 and the iterations within LDPC decoder 224. For each iteration between SOVA 220 and LDPC decoder 224, check node and bit node update modules 250 and 260 may perform a plurality of message passing iterations. Accordingly, for simplicity, the iterations between a SOVA and LDPC decoder may be referred to as "outer iterations" and the iterations within an LDPC decoder may be referred to as "inner iterations." In each inner iteration, check node update module 250 may use the LLRs computed by SOVA 220 in the last outer iteration, as well as the LLRs provided by bit node update module 260 in the last inner iteration. Similarly, in each inner iteration, bit node update module 260 may use the LLRs computed by SOVA 220 in the last outer iteration, as well as the LLRs provided by check node update module 250 in the last inner iteration.

Even after a predetermined number of outer and inner iterations, LDPC decoder 224 may not produce a valid codeword if a trapping set is present in the tentative codeword. Thus, like in system 100, system 200 includes LDPC post-processor 226 to change inputs or other values within LDPC decoder 224 so that the output of LDPC decoder 224 does not converge to the same near-codeword as before. In some embodiments, LDPC post-processor 226 may change the channel detector inputs to LDPC decoder 224 that would otherwise have been provided by SOVA 220. That is, as described above, LDPC decoder 224 may have a plurality of inputs that are each used to obtain a different bit of received codeword 122. Instead of obtaining all of the bits of received codeword 122, some of the inputs may instead receive values provided by LDPC post-processor 226. System 200 may therefore include multiplexer 225 to select between the outputs of SOVA 220 and LDPC post-processor 226.

In some embodiments, multiplexer 225 may be controlled by LDPC post-processor 226. LDPC post-processor 226 may control multiplexer 225 to select the output of SOVA 220 for all bits in the initial n_iter iterations. This enables LDPC decoder 224 to compute the tentative codeword using a standard decoding process. Standard decoding may hereinafter refer to decoding that is performed without inputs provided by an LDPC post-processor 226. If errors are p'resent in the tentative codeword, e.g., due to a trapping set, LDPC post-processor 226 may control multiplexer 225 to select the output of LDPC post-processor 226 for some of the bit positions, and the output of SOVA 220 for the remainder of the bit positions. In this way, LDPC decoder 224 may perform an extra n_iter_extra iterations with altered inputs, thereby preventing (in many scenarios) the output from converging to the same, erroneous codeword.

In some embodiments, LDPC decoder 224 may be re-initialized before performing the extra n_iter_extra iterations. In particular; the messages passed between check node update module 150 and bit node update module 160 may be set to zero. In other embodiments, LDPC decoder 224 may preserve the messages passed between modules 150 and 160. In other words, LDPC decoder 224 may use the final messages produced after iteration number n_iter as the initial messages when extra iterations are performed. Re-initialization, however, may generally produce a higher performance. Re-initialization may involve re-running SOVA 220.

While system 200 is shown and described to use a SOVA component as the channel detector, it should be understood that any other suitable channel detector may be employed instead. For example, in some embodiments, system 200 may instead employ a BCJR channel detector.

The operation of LDPC post-processor 226 (FIG. 2) will now be described with reference to FIGS. 3-9C. These figures will generally illustrate the ways in which LDPC post-processor 226 may select bit positions to alter, and the ways in which LDPC post-processor 226 may modify LDPC decoder 224. It should be understood that LDPC post-processor 126 may operate in the same of similar manner.

Referring again to FIG. 3, (4, 3) trapping set 300 is an illustrative example of a trapping set that may be present in a tentative codeword. From the check nodes associated with the tentative codeword, LDPC post-processor 226 may identify candidate bit positions of the tentative codeword that are potentially erroneous. LDPC post-processor 226 may identify each of the bit nodes associated with at least one unsatisfied check as a candidate for being erroneous. For example, as shown in FIG. 3, trapping set 300 includes three unsatisfied checks, which are labeled $c_1$, $c_2$, and $c_3$. LDPC post-processor 226 may identify that there are six bit nodes (302, 304, 308, 310, 312, and 314) associated with these three unsatisfied checks in the tentative codeword. In particular, LDPC post-processor 226 may identify symbol nodes 302 and 304 as potentially erroneous due to their association with check node $c_1$, bit node 308 due to its association with check nodes $c_1$ and $c_2$, bit nodes 310 due to its association with check node $c_3$, bit nodes 312 due to its association with check node $c_2$, and bit node 314 due to its association with check nodes $c_2$ and $c_3$.

LDPC post-processor 226 may selectively change the inputs to LDPC decoder 224 that correspond to the bit positions of the potentially erroneous, bits. For example, if trapping set 300 (FIG. 3) is present in the tentative codeword, LDPC post-processor 226 may control multiplexer 225 to change the inputs to one or more of the bit positions associated with bit nodes 302, 304, 308, 310, 312, and 314. For the remainder of the bit positions in the tentative codeword, LDPC post-processor 226 may control multiplexer 225 to provide the LLRs outputted by SOVA 220.

In some embodiments, LDPC post-processor 226 may select one of the unsatisfied check nodes from all of the unsatisfied checks in the syndrome, and may change the values for the bit nodes associated with the selected unsatisfied check node. For example, in FIG. 3, LDPC post-processor 226 may change the inputs to LDPC decoder 224 associated with the bit nodes connected to check node $c_1$—that is, bit nodes 302, 304, and 308. Thus, of the six potentially erroneous bits, LDPC post-processor 224 may change three. At a different time, LDPC post-processor 226 may instead change the inputs to LDPC decoder 224 for the bit nodes associated with check node $c_2$ (e.g., bit nodes 308, 312, and 314), or for the bit nodes associated with check node $c_3$ (e.g., bit nodes 310 and 314).

Figure 4A:
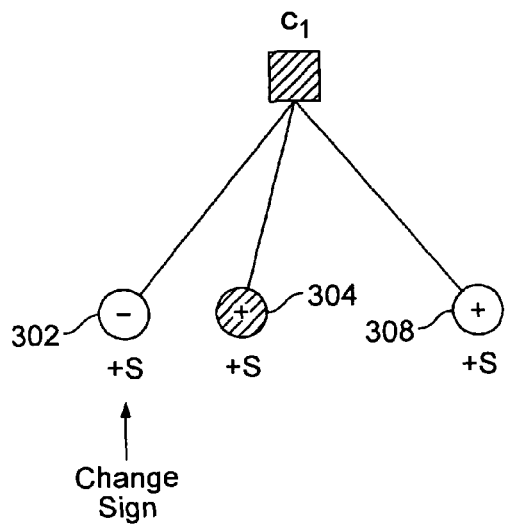
FIGS. 4A and 4B are graphical illustrations of the disclosed post-processing algorithm using bit node correction with one bit node.
Figure 4B:
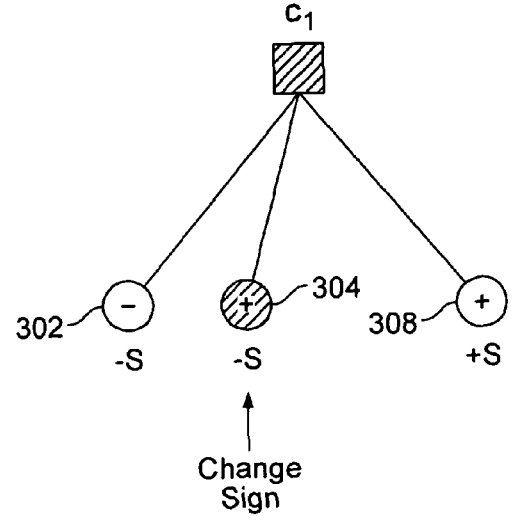

FIGS. 4A and 4B illustrate a technique that LDPC post-processor 226 may employ to select LLR values for the potentially erroneous bits associated with check node $c_1$. In this example, after LDPC decoder 224 performs the initial n_iter iterations of decoding, the tentative codeword may have a negative LLR for bit node 302 (indicating a likely "1") and positive LLRs for bit nodes 304 and 308 (indicating a likely "0"). Since bit node 304 is actually erroneous, the actual values for these bit nodes are "1," "1," and "0," respectively (not "1," "0," and "0"). For these three bit nodes, LDPC post-processor 226 may set the LLR magnitude of each bit node to a predetermined magnitude. The predetermined magnitude may be hereinafter referred to by the variable "S," and may be the maximum magnitude that the particular decoder system is capable of using. For example, if the system uses six bit integers to represent the magnitude of an LLR, LDPC post-processor 226 may set each of these bit nodes to +63 or −63. This maximal magnitude provides LDPC decoder 224 with information indicating a high level of certainty of the correctness of the LLRs provided by LDPC post-processor 226, and maximizes the effect that LDPC post-processor 226 has on the decoding process.

For the sign of the LLRs for these bit nodes, LDPC post-processor 226 may use the sign of the original LLR (e.g., in the tentative codeword after the n_iter iterations) for all but one of the bit nodes. That is, LDPC post-processor 226 may select one bit node associated with check node $c_1$ to assign the sign opposite of the original sign, and may set the LLR value for the remaining bit nodes to the same sign as the original sign. This may allow LDPC post-processor 224 to correct one of the bit nodes associated with check node $c_1$, which may or may not be the bit node containing the error.

In the example of FIG. 4A, LDPC post-processor 226 changes the sign of bit node 302, but uses the same sign for bit nodes 304 and 308. Thus, by appropriately controlling multiplexer 225, the additional n_iter_extra iterations of LDPC decoder 224 may be run with +S as the initial LLR values of bit nodes 302, 304, and 308 instead of the LLR values provided by SOVA 220. All other bit nodes not associated check $c_1$ may still use the LLR values provided by SOVA 220.

LDPC post-processor 226 may attempt the same correction for any or all the other bit nodes associated with check node $c_1$. For example, referring to FIG. 4B, after (or before) LDPC post-processor 226 performs n_iter_extra iterations with a correction to bit node 302, LDPC post-processor 226 may instead flip the sign for the LLR associated with bit node 304, leaving the other LLRs with the same sign as that following the initial n_iter iterations. In particular, LDPC post-processor 226 may change the positively-valued original LLR of bit node 304 to a new value of −S. LDPC decoder 224 may then run another n_iter_extra iterations (which may be the same or a different number of iterations than that used when changing the LLR sign of bit node 302). Because, in the example of FIG. 4B, LDPC post-processor 226 has forced the LLR values of bit nodes 302, 304 and 308 to their correct values, the LLRs produced by LDPC decoder 426 are unlikely to converge to a codeword having the same trapping set as shown in FIG. 3. Also, the values of bit nodes 302, 304, and 308 after the n_iter_extra iterations complete, are likely to converge to correct values.

LDPC post-processor 226 may iterate through all of the bit nodes associated with check $c_1$ so that each bit node is selected to be set to an opposite LLR sign. That is, LDPC post-processor 226 tries to satisfy the unsatisfied check node $c_1$ by assuming that each of the bit nodes associated with check node $c_1$ may be the erroneous bit. LDPC post-processor 226 may perform this type of correction for all of the unsatisfied checks in the received codeword. For example, referring briefly back to FIG. 3, LDPC post-processor 226 may change the LLR inputs to LDPC decoder 224 for those bit nodes associated with checks $c_2$ and $c_3$ (in any suitable order).

In some embodiments, if the above-described technique of performing post-processing correction on one bit node does not produce a valid codeword, LDPC decoding may terminate with a decoding failure. In other embodiments, LDPC post-processor 226 may change additional inputs to LDPC decoder 224. For example, LDPC post-processor 224 may select two check nodes (e.g., $c_1$ and $c_2$, $c_1$ and $c_3$, and/or $c_2$ and $c_3$), and may perform post-processing correction on two bit nodes (one for each of the selected check nodes).

Figure 5:
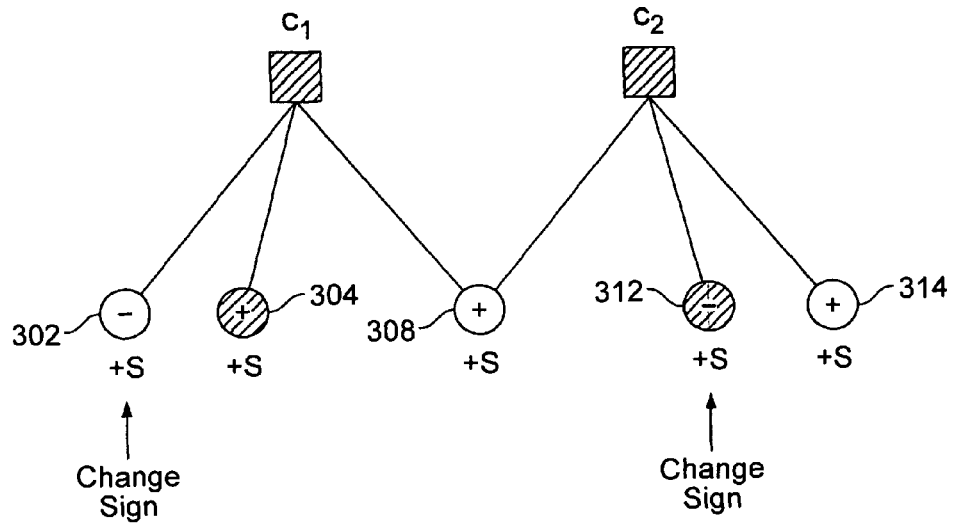
FIG. 5 is a graphical illustration of the disclosed post-processing algorithm using bit node correction with two bit nodes.

FIG. 5, in particular, shows an example of the LLRs that LDPC post-processor 224 may assign to the bit nodes associated with $c_1$ and $c_2$. In particular, LDPC post-processor 224 may iterate through the bit nodes associated with $c_1$ and $c_2$, and LDPC post-processor 224 may change the signs for the LLRs of bit nodes 302 (for $c_1$) and bit node 312 (for $c_2$).

In FIG. 5, bit node 308 is associated with both unsatisfied checks $c_1$ and $c_2$. Generally, from empirical evidence, an erroneous bit node is associated with no more than one unsatisfied check. Therefore; bit node 308 may be assumed to be correctly decoded. That is, when iterating through bit nodes, LDPC post-processor 226 may not select bit node 308 as a bit node to assign an opposite sign. This reduces the number of iterations needed to ensure that all relevant bit nodes have been corrected. The number of extra iterations performed by LDPC decoder 224 is thereby advantageously reduced.

Figure 6:
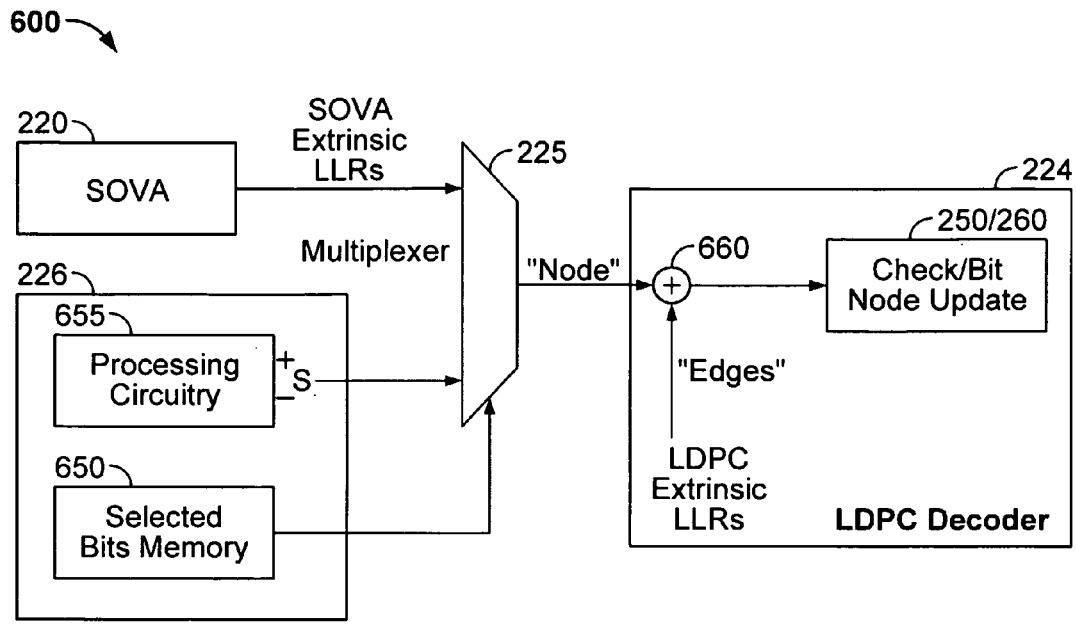
FIG. 6 is a more detailed, yet still simplified, block diagram of the decoding system in FIG. 2.

FIG. 6 shows a simplified block diagram of a portion of decoding system 600. The block diagram of decoding system 600 may be a more detailed view of the decoding system in FIG. 2. Decoding system 600 may therefore include the same or similar components as in FIG. 2, including SOVA 220, LDPC decoder 224, multiplexer 225, and LDPC post-processor 226. Looking first to LDPC decoder 224, LDPC decoder 224 may include check/bit node update modules 250 and 260 (described above in connection with FIG. 2) and adder 660. Adder 660 may provide the information that check/bit node update modules 250 and 260 uses to iteratively update the check nodes and bit nodes corresponding to a received codeword. Adder 660 may be configured to combine (e.g., by unweighted addition or weighted addition) the output of multiplexer 225 with LDPC extrinsic LLRs. The output of multiplexer 225 represents the output of the channel, as provided by SOVA 220, or as modified by LDPC post-processor 226. These LLRs may sometimes be referred to as "node" LLR values, since their values may be used as the initial bit node values for initializing the iterative message passing algorithm. The LDPC extrinsic LLRs represent the edge LLR messages passed from the last check node or bit node update in the iterative message passing algorithm. In other words, the output of multiplexer 225 provides the LLR associated with an outer iteration, while the LDPC extrinsic LLRs are associated with an inner iteration.

LDPC post-processor 226 may include selected bits memory 650 and processing circuitry 655. Selected bits memory 650 can be any suitable type of storage medium, such as RAM, ROM, FLASH, etc., and may be configured to provide an output that controls multiplexer 225. That is, selected bits memory 650 may store different selection combinations that cause multiplexer 225 to select LLRs provided by SOVA 220 for all except certain bit nodes, as described above. For example, one selection combination stored in selected bits memory 650 may be used to control multiplexer 225 to select all bit nodes from SOVA 220 except those associated with a particular check $c_1$, while another selection combination may be used to control multiplexer 225 to select all bit nodes from SOVA 220 except those associated with two particular checks (e.g., $c_2$ and $c_2$).

Processing circuitry 655 may be coupled to selected bits memory 650, and may determine which combination stored in selected bits memory 650 to use to control multiplexer 225. More particularly, processing circuitry 655 may be configured to iterate through all of the unsatisfied checks, and may ensure that all (or a sufficiently many) of the unsatisfied checks are used to determine which SOVA outputs to change. Processing circuitry 655 may also be configured to determine the sign of the LLR provided to multiplexer 225. For example, using the original LLRs from the tentative codeword, processing circuitry 655 may determine whether to output +S or −S, and which of the bit nodes to change the sign of (from the signal of the original tentative codeword), as described above. Processing circuitry 655 may also be configured to control multiplexer 225 to select +S or −S each time an outer iteration is completed—thus preventing an output from SOVA 220 from affecting the initial node LLR for the bit positions of interest.

As described above, in some embodiments, LDPC decoder 224 may be re-initialized before the extra n_iter_extra iterations are performed. In FIG. 6, re-initialization may include setting the LDPC extrinsic LLRs to zero.

In some embodiments, LDPC post-processor 226 (FIG. 2) may be used to modify the edge LLR values instead of the node LLR values. This arrangement is illustrated in FIG. 7.

Figure 7:
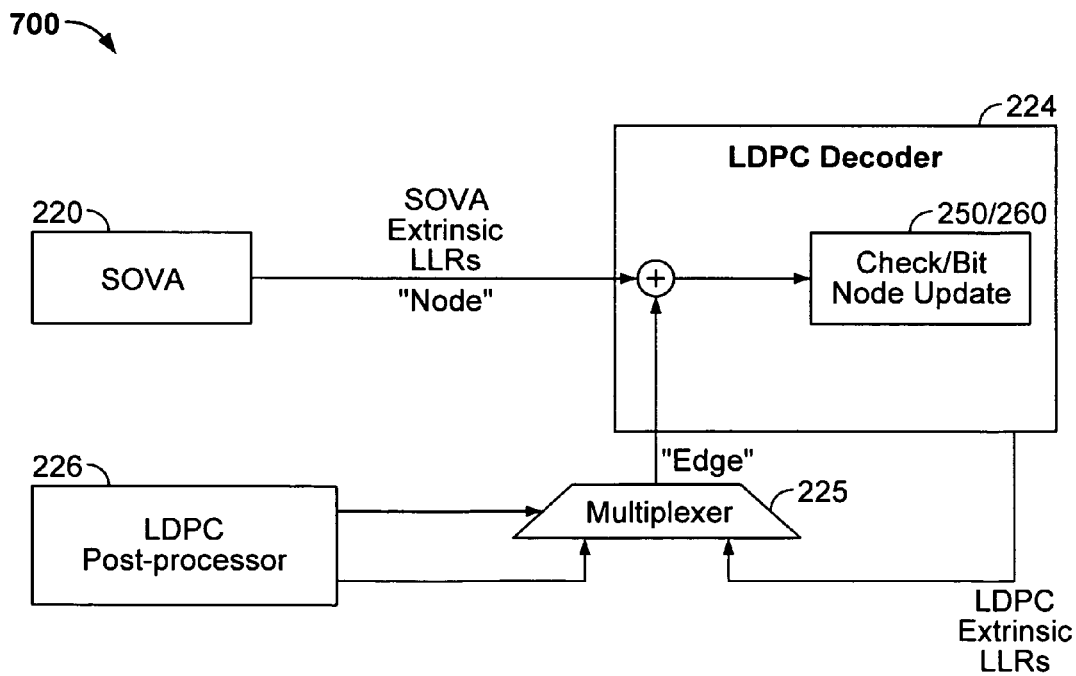
FIG. 7 is a simplified block diagram of the decoding system components of FIG. 2 arranged and configured in a different manner.

FIG. 7 shows a simplified block diagram of decoding system 700. Decoding system 700 may be similar in features and functionality to decoding system 600 of FIG. 6, except that several of the components are rearranged. In particular, in decoding system 700, LDPC post-processor 226 is configured to control multiplexer 225 to select between the LDPC extrinsic LLRs (provided by LDPC decoder 224) and an output provided by LDPC post-processor 226, rather than selecting between the outputs of SOVA 220 and LDPC post-processor 226. This enables LDPC post-processor 226 to either set a particular edge to a value provided by LDPC post-processor 226 or provide the LLR computed in the last iteration of the message passing algorithm. At the beginning of each set of n_iter_extra iterations, edges not selected by LDPC post-processor 226 may be set to zero for embodiments in which re-initialization is desired.

Figure 8A:
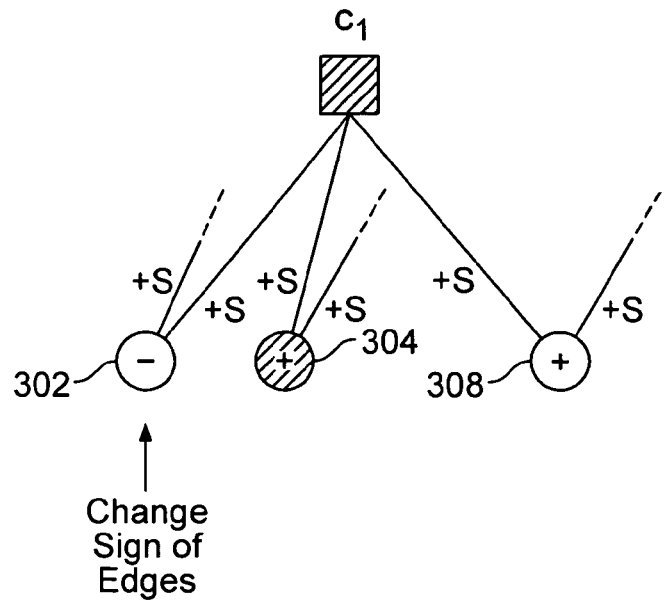
FIGS. 8A and 8B are graphical illustrations of the disclosed post-processing algorithm using edge correction.
Figure 8B:
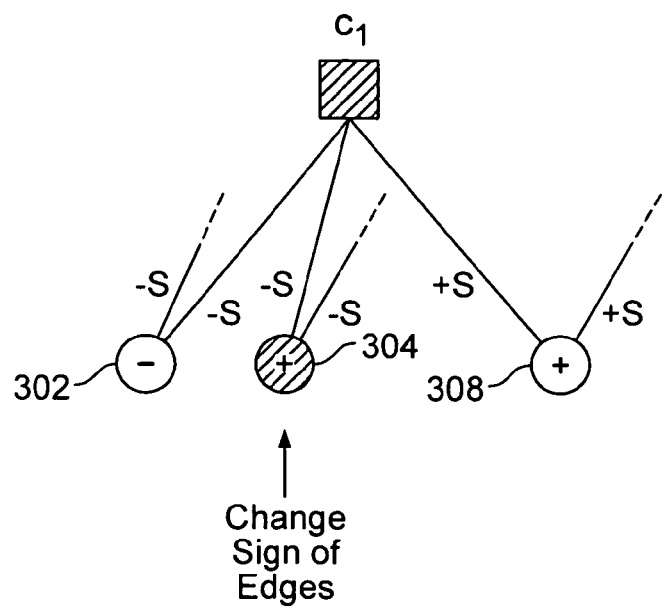

FIGS. 8A and 8B illustrate one technique that LDPC post-processor 226 (FIG. 7) may employ to select new edge LLRs. FIGS. 8A and 8B show a partial Tanner graph that illustrates check node $c_1$ and the potentially erroneous symbols associated with check node $c_1$. FIGS. 8A and 8B represent the same example setup illustrated in FIGS. 4A and 4B, respectively. In some embodiments, as shown in FIG. 8A, LDPC post-processor 226 may select +S, +S, and +S for bit nodes 302, 304, and 308, respectively, so that the new LLR for bit node 302 is given a sign opposite from its original sign, while the new LLRs for the remaining bit nodes are assigned the same signs. However, instead of using these values as the initial LLR for the bit node, LDPC post-processor 226 may provide these LLRs as the edge LLRs. In particular, the two edges connected to each of bit nodes 302, 304, and 308 may be fixed to an LLR of +S. By freezing the edges in this way, when the corresponding LDPC decoder (LDPC decoder 224) performs n_iter_extra iterations of the message passing algorithm, the LLR messages passed between the check and bit node update modules associated with these six edges may be fixed regardless of the previous result provided by the check or bit node update module.

FIG. 8B illustrates the edge LLR values provided by LDPC post-processor 226 (FIG. 7) when LDPC post-processor 226 changes the sign of bit node 304 from the sign computed after the initial n_iter iterations, but uses the same sign for bit nodes 302 and 308. Here, the two edges connected to bit node 302 may be fixed to LLRs of +S, the two edges connected to bit node 304 may be fixed to LLRs of −S, and the two edges connected to bit node 308 may be fixed to LLRs of +S.

In FIG. 8B, LDPC post-processor 226 (FIG. 7) requires that its corresponding LDPC decoder use correct values for these six edges, while LDPC decoder 224 (FIG. 7) performs n_iter_extra iterations. In other words, using this technique, LDPC post-processor 226 may not allow LDPC decoder 224 to produce an output for which bit node 304 is again erroneous. Generally, when LDPC post-processor 226 changes the sign of an erroneous bit, the technique of freezing edges may either produce a valid codeword, or an invalid codeword—for example, a codeword having a different but overlapping trapping set.

Figure 9C:
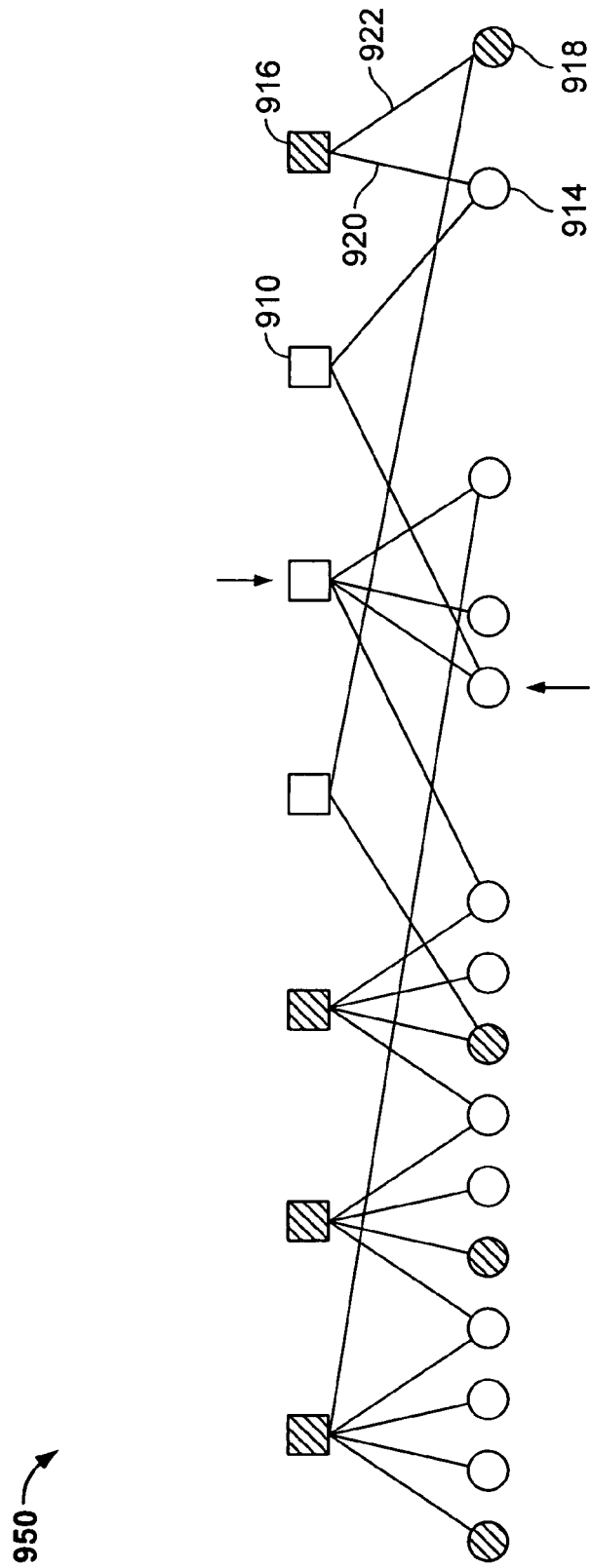

FIGS. 9A-9C illustrate an example in which freezing the edges of nodes and running n_iter_extra extra iterations of the decoding algorithm may produce a different trapping set from the original trapping set associated with the tentative codeword. Referring first to FIG. 9A, a Tanner graph representation of trapping set 900 is shown. Trapping set 900 is a (6, 4) trapping set, since trapping set 900 includes six erroneous bit nodes collectively associated with four unsatisfied checks. At some point in the post-processing algorithm, LDPC post-processor 226 may select check node 908 as the check node whose associated edges are frozen, and may select bit node 902 as the bit node to correct. In particular, LDPC post-processor 226 may choose bit node 902 as the node whose associated edges are assigned the opposite sign (e.g., −S when the original LLR sign of bit node 902 is positive, or +S when the original sign is negative). Here, edges 904 and 906 (in addition to others) are frozen to values of +S or −S. After one or more iterations, the +S or −S LLR may affect the value of bit node 902 and check nodes 908 and 910.

FIG. 9B shows the resulting bit nodes and check nodes after edges 904 and 906 are frozen. Because edges 904 and 906 provide LLRs with correct information about bit node 902 (instead of the incorrect information from the original n_iter iterations), check node 908 may be satisfied and check node 910 may be unsatisfied. More particularly, with bit node 902 providing correct information, check node 908 is associated with four correct bit nodes and no erroneous bit nodes, and is therefore satisfied. Check node 910 is associated with one correct bit node (bit node 902) and one erroneous bit node (bit node 914), and is therefore unsatisfied.

Because check node 910 is unsatisfied in FIG. 9B, the information passed via edge 912 may allow LDPC decoder 226 to correct bit node 914 after one or more iterations. This correction produces the resulting bit nodes and check nodes shown in FIG. 9C. Here, the correction of bit node 914 causes check node 910 to be satisfied and check node 916 to be unsatisfied (since check node 916 is still associated with erroneous bit node 918). At this point, LDPC decoder 224 may not be able to perform any additional corrections even if many more iterations of the message passing algorithm are performed. Thus, FIG. 9C may illustrate trapping set 950, which is a (4, 4) trapping set that overlaps with the (6, 4) trapping set 900 of FIG. 9A. Trapping set 950 overlaps with trapping set 900 since both trapping sets include erroneous bits at the same three positions and unsatisfied checks at the same three positions.

The example of FIGS. 9A-9C shows that, even if the LDPC decoder is constrained by the LDPC post-processor to correct one erroneous bit of a trapping set (e.g., correcting bit node 902 in trapping set 900 in FIGS. 9A-9C), the LDPC decoder is not necessarily able to produce a valid codeword. In practice, however, there would need to be a very large number of overlapping trapping sets in order for the LDPC decoder, operating in conjunction with the LDPC decoder, to fail at correcting the received codeword. In the worst case scenario, assuming that the received codeword is correctable, the LDPC post-processor may need to attempt to correct every bit node associated with every unsatisfied check (in the manner discussed above) in order to successfully decode a received codeword. If the LDPC post-processor is configured to select one unsatisfied check at a time, the LDPC decoder may need to perform approximately $s*d_c*n\_iter\_extra$ extra iterations to produce a valid codeword, where s is the number of unsatisfied checks after the initial n_iter iterations, and $d_c$ is the average number of bit nodes associated with each unsatisfied check node. If the LDPC post-processor is configured to select two unsatisfied check nodes at a time to perform correction, the LDPC decoder may heed to perform approximately (s choose 2)$*d_c*n\_iter\_extra$ extra iterations.

FIGS. 10-14 show simplified flow charts of illustrative processes for decoding a received LDPC codeword. The steps in these processes may be performed by an LDPC post-processor (e.g., LDPC post-processor 126 of FIG. 1 or LDPC post-processor 226 of FIGS. 2 and 7) operating in conjunction with an LDPC decoder (e.g., LDPC decoder 124 of FIG. 1 or LDPC decoder 224 of FIGS. 2 and 7). It should be understood that the processes of FIGS. 10-14 are merely illustrative, and that any steps in these processes may be removed, modified, combined, and steps may be added, without departing from the scope of the present invention.

Figure 10:
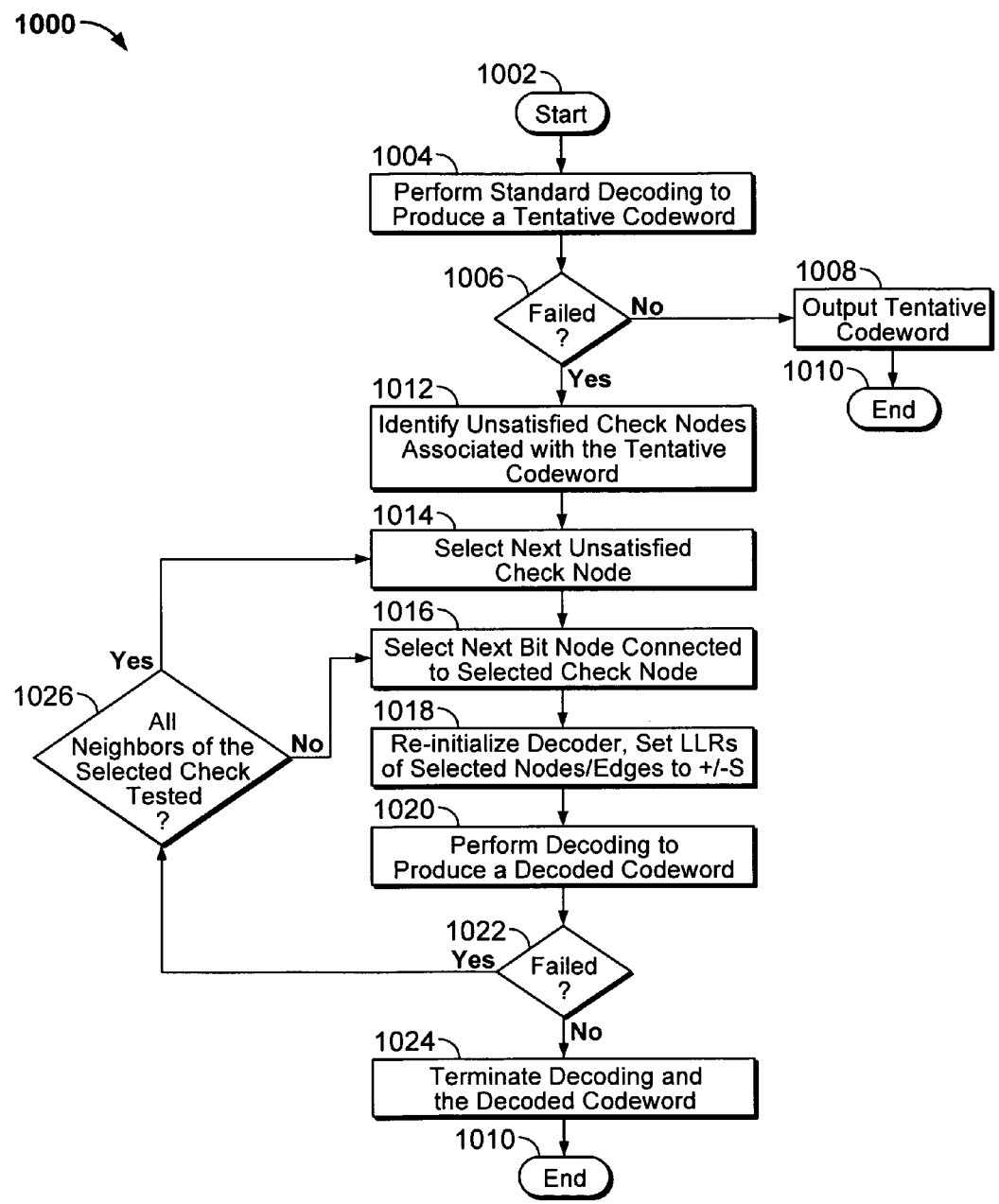
FIGS. 10-13 are flowchart of illustrative processes for decoding a received codeword with post-processing using one bit node.

Referring first to FIG. 10, process 1000 is shown for decoding a received LDPC codeword, where the LDPC post-processor performs correction using LDPC decoder re-initialization. Process 1000 starts at step 1002. At step 1004, the LDPC decoder performs standard decoding on the received codeword to produce a tentative codeword. For example, the LDPC decoder may perform n_iter iterations of an iterative message passing algorithm to produce a tentative codeword and a plurality of checks (or syndrome) corresponding to the tentative codeword. At step 1006, the LDPC decoder or post-processor determines whether the standard decoding failed. For example, the LDPC decoder or post-processor may determine whether an error (e.g., trapping set) is present in the tentative codeword by, for example, identifying whether any of the checks associated with the tentative codeword are unsatisfied. If, at step 1006, the LDPC decoder or post-processor determines that standard decoding did not fail, the LDPC post-processor may output the tentative codeword (or the corresponding user information estimate) at step 1008. Process 1000 then ends at step 1010.

If, at step 1006, the LDPC decoder or post-processor instead determines that standard decoding failed, process 1000 may continue to step 1012. At step 1012, the LDPC post-processor may identify the unsatisfied check nodes associated with the tentative codeword. Then, at step 1014, the LDPC post-processor may select the next unsatisfied check node. For example, when process 1000 first reaches this step, the LDPC post-processor may choose a first or left-most unsatisfied check node in the syndrome. The LDPC post-processor may then, at step 1016, select the next bit node connected to the selected check node. For example, when process 1000 first reaches this step, the LDPC post-processor may select a first or left-Most bit node in the tentative codeword connected to the selected check.

Process 1000 may continue to step 1018. At step 1018, the LDPC post-processor may re-initialize the LDPC decoder and change a portion of the inputs to the LDPC decoder. If the LDPC post-processor changes the inputs corresponding to node LLRs, the LDPC post-processor may request that the LDPC decoder set all of its edge LLRs to zero. Also, the LDPC post-processor may set the node LLRs for appropriate bit nodes to +S or −S, as described above. That is, the LDPC post-processor may set the LLR for the selected bit node (from step 1016) to a magnitude of S and a sign opposite of that from the corresponding bit position in the tentative codeword. For the remaining bit nodes connected to the selected check (from step 1014), the LDPC post-processor may set the LLRs to a magnitude of S and signs that are the same as the corresponding bit positions in the tentative codeword. If, at step 1018, the LDPC post-processor changes edge LLRs, the LDPC post-processor may change the appropriate edge LLRs to +S or −S as described above, and may request that the LDPC decoder set all remaining edge LLRs to zero.

Then, at step 1020, the LDPC decoder may perform LDPC decoding to produce a decoded codeword. The LDPC decoder may, for example, perform n_iter_extra iterations of the iterative message passing algorithm, where the inputs selected in the previous steps are changed. The LDPC decoder or post-processor may then determine at step 1022 whether the decoding failed. If decoding did not fail, process 1000 may continue to step 1024, where the LDPC decoder terminates decoding and outputs the decoded codeword (or the corresponding user information estimate). Thus, in this embodiment, the LDPC decoder and post-processor are configured to terminate decoding once a valid codeword is identified. Otherwise, if decoding failed, process 1000 continues to step 1026.

At step 1026, the LDPC post-processor determines whether all neighbors of the selected check (e.g., bit nodes connected to the selected check) have been tested. If not, process 1000 returns to step 1016, and the LDPC post-processor selects the next bit node connected to the selected check node. If instead, at step 1026, the LDPC post-processor determines that all bit nodes corresponding to the selected check have been tested, process 1000 returns to step 1014 where the LDPC post-processor selects the next unsatisfied check node to perform correction on. In this way, the LDPC post-processor may loop through all the unsatisfied checks, if necessary, and all bit nodes associated with each unsatisfied check, if necessary, to compute and output a valid codeword.

Figure 11:
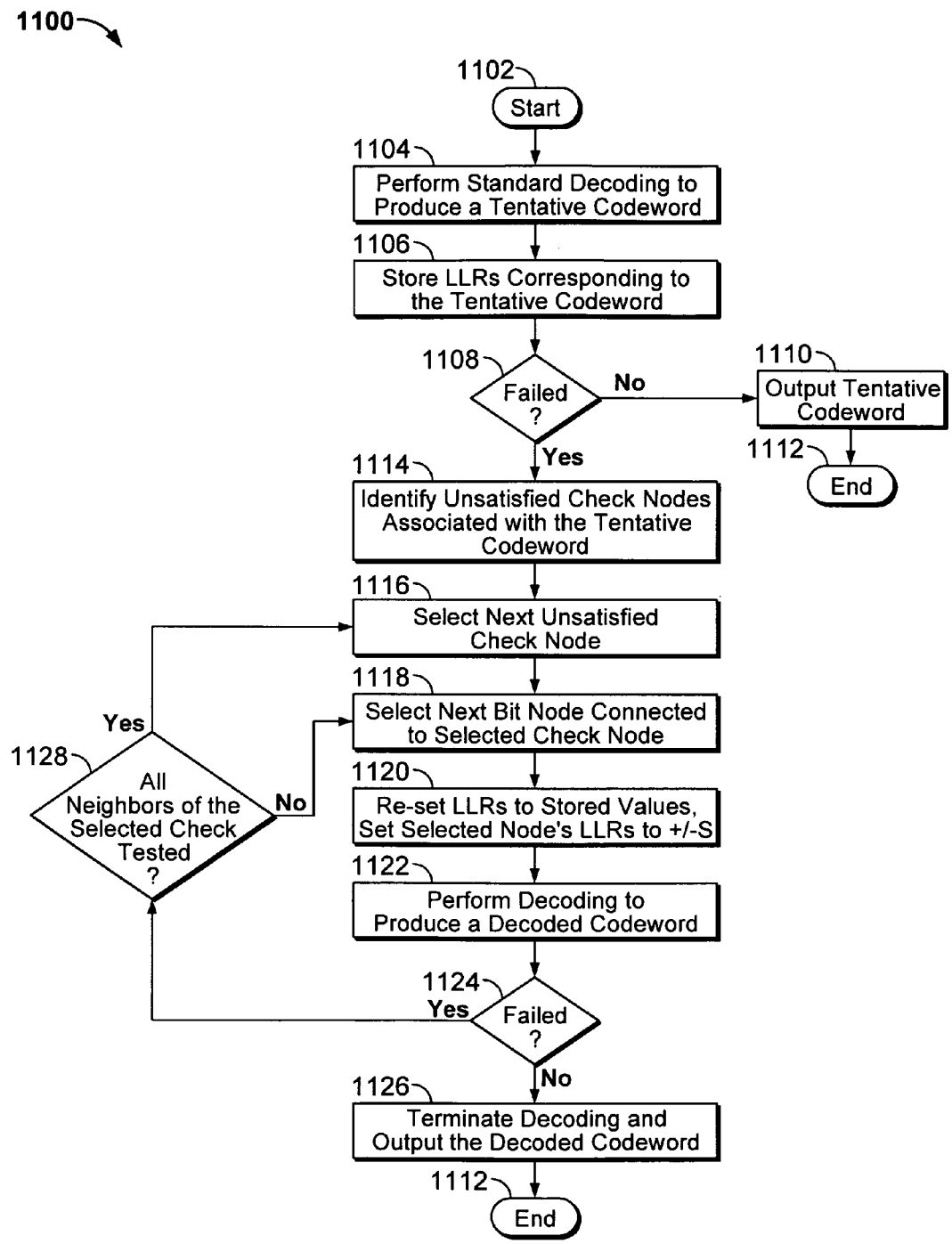

Referring to FIG. 11, process 1100 is shown for decoding a received LDPC codeword, where the LDPC post-processor performs correction using LDPC decoder re-set. Process 1100 starts at step 1102. At step 1104, the LDPC decoder performs standard decoding on received codeword 122 to produce a tentative codeword. For example, the LDPC decoder may operate in a similar or identical manner as described in step 1004 (FIG. 10). At step 1106, the LDPC decoder or post-processor stores the LLRs corresponding to the tentative codeword. The LLRs may be determined, for example, as the final process in step 1004 or as a another process in step 1104. The LDPC decoder may store the LLRs in selected bits memory 650.

At step 1108, the LDPC decoder or post-processor determines whether the standard decoding failed. If, at step 1108, the LDPC decoder or post-processor determines that standard decoding did not fail, the LDPC post-processor may output the tentative codeword (or the corresponding user information estimate) at step 1110. Process 1100 then ends at step 1112. If, at step 1108, the LDPC decoder or post-processor instead determines that standard decoding failed, process 1100 may continue to step 1114. At step 1114, the LDPC post-processor may identify the unsatisfied check nodes associated with the tentative codeword. For example, the unsatisfied check node may be identified by computing the syndrome of received codeword 122. Then, at step 1116, the LDPC post-processor may select the next unsatisfied check node. For example, the LDPC post-processor may choose the next unsatisfied check node using a process similar or identical to that described in step 1012 (FIG. 10). The LDPC post-processor may then, at step 1118, select the next bit node connected to the selected check node. The next bit node may be selected by any suitable method. For example, bits nodes may be selected from left-to-right in a Tanner graph representation of the LDPC code.

Process 1100 may continue to step 1120. At this step, the LDPC post-processor may re-set the LLRs not contained in the set of selected bit and/or check nodes to the values stored at step 1106. The LDPC post-processor may set the LLRs for bit nodes in the set of selected nodes to +S or −S, where +S and −S are maximum and minimum values of the LLR, respectively, and are described, for example, in step 1016 (FIG. 10).

At step 1122, the LDPC decoder may perform LDPC decoding to produce a decoded codeword. For example, the LDPC decoder may perform LDPC decoding similarly or identically to the manner described in step 1020 (FIG. 10). The LDPC decoder or post-processor may then determine at step 1124 whether the decoding failed. If decoding did not fail, process 1100 may continue to step 1126, where the LDPC decoder terminates decoding and outputs the decoded codeword (or the corresponding user information estimate). Thus, in this embodiment, the LDPC decoder and post-processor are configured to terminate decoding once a valid codeword is identified. Otherwise, if decoding failed, process 1100 continues to step 1128.

At step 1128, the LDPC post-processor determines whether all neighbors of the selected check (e.g., bit nodes connected to the selected check) have been tested. If not, process 1100 returns to step 1118, and the LDPC post-processor selects the next bit node connected to the selected check node. If instead, at step 1128, the LDPC post-processor determines that all bit nodes corresponding to the selected check have been tested, process 1100 returns to step 1116 where the LDPC post-processor selects the next unsatisfied, check node to perform correction on.

Thus, in this embodiment, the LDPC decoder and post-processor are configured to terminate decoding once a valid codeword is identified.

Figure 12:
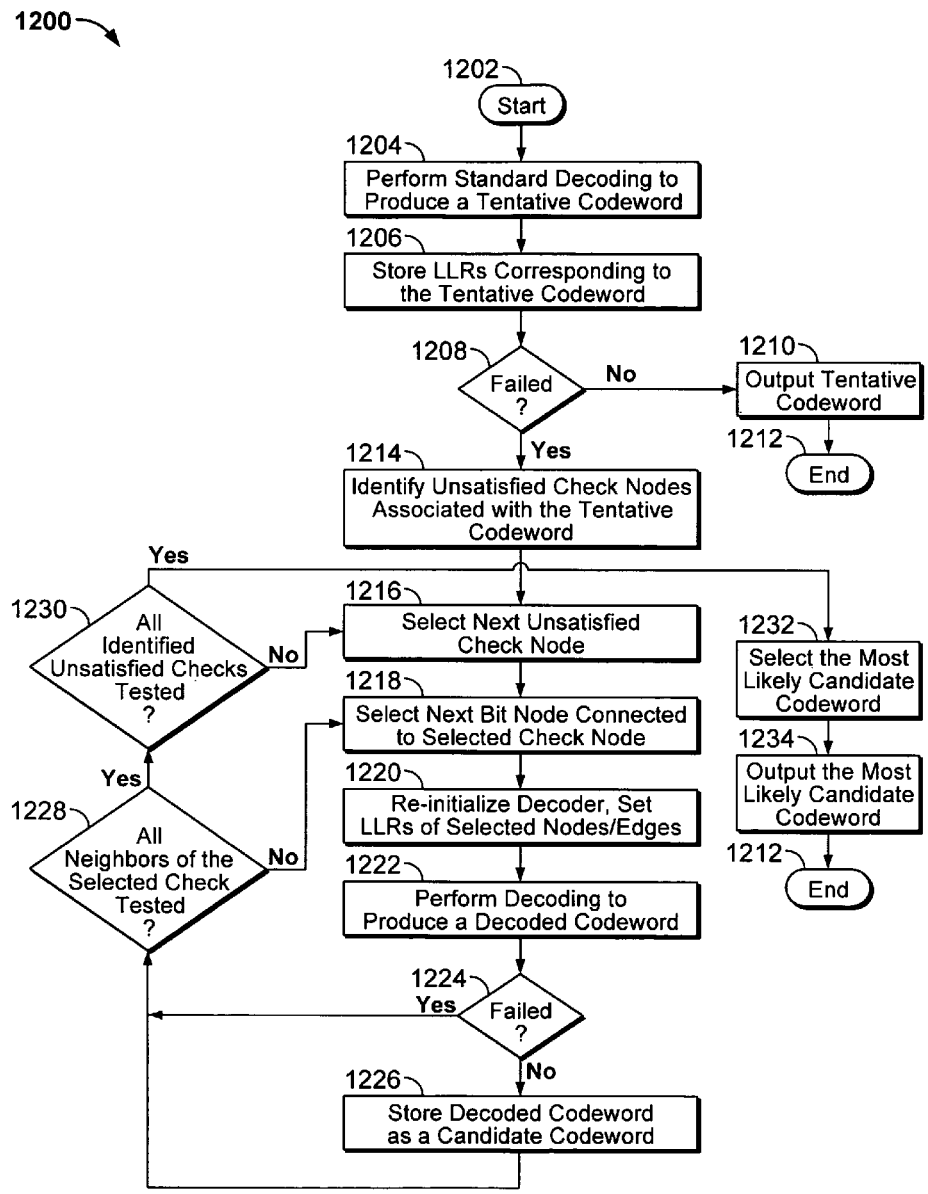

Referring to FIG. 12, process 1200 is shown for decoding a received LDPC codeword, where the LDPC post-processor performs correction using LDPC decoder re-initialization. When standard decoding of received codeword 122 does not produce a valid codeword, process 1200 may generate more than one candidate codeword. Such candidate codewords may then be evaluated, and the most likely candidate codeword may be selected as the output codeword.

Process 1200 starts at step 1202. At step 1204, the LDPC decoder performs standard decoding on received codeword 122 to produce a tentative codeword. For example, the LDPC decoder may operate in a similar or identical manner as described in step 1004 (FIG. 10). At step 1206, the LDPC decoder or post-processor stores the LLRs corresponding to the tentative codeword that may be determined, for example, in step 1204. The LDPC decoder may store the LLRs in selected bits memory 650. At step 1208, the LDPC decoder or post-processor determines whether the standard decoding failed. If, at step 1208, the LDPC decoder or post-processor determines that standard decoding did not fail, the LDPC post-processor may output the tentative codeword (or the corresponding use information estimate) at step 1210. Process 1200 then ends at step 1212. If, at step 1208, the LDPC decoder or post-processor instead determines that standard decoding failed, process 1200 may then continue to step 1214. At step 1214, the LDPC post-processor may identify the unsatisfied check nodes associated with the tentative codeword. Then, at step 1216, the LDPC post-processor may select the next unsatisfied check node. For example, the LDPC post-processor may choose the next unsatisfied check node using a process similar or identical to that described in step 1012 (FIG. 10). The LDPC post-processor may then, at step 1218, select the next bit node connected to the selected check node.

Process 1200 may continue to step 1220. At step 1220, the LDPC post-processor may re-initialize the LDPC decoder similarly or identically to the steps described in step 1018 (FIG. 10). For example, the LDPC post-processor may set the node LLRs for selected bit nodes to +S or −S. If, at step 1220, the LDPC post-processor changes edge LLRs, the LDPC post-processor may change the appropriate edge LLRs to +S or −S, and may request that the LDPC decoder set all remaining edge LLRs to zero.

At step 1222, the LDPC decoder may perform LDPC decoding to produce a decoded codeword. For example, the LDPC decoder may perform LDPC decoding similarly or identically to the manner described in step 1020 (FIG. 10). Process 1200 may then continue at step 1224, in which LDPC decoder or post-processor determines whether the decoding failed. If the decoding at step 1224 does not fail, process 1200 may continue to step 1226, where the LDPC decoder stores the decoded codeword as a candidate codeword. For example, the decoded codeword may be stored in selected bits memory 650. Process 1200 may continue to step 1228 from either step 1226 (if the decoding did not fail) or step 1224 (if the decoding failed), where process 1200 determines if all neighboring bit nodes of the check node determined in the previous iteration of step 1216 have been selected. If not, process 1200 may return to step 1218, and the LDPC post-processor may select the next bit node connected to the check node determined in step 1216. If instead, at step 1228, the LDPC post-processor determines that all bit nodes corresponding to the selected check have been tested, process 1200 may continue to step 1230 where the LDPC post-processor determines if all unsatisfied check nodes have been selected. If not all check nodes have been selected, process 1200 may return to step 1216, where the next unsatisfied check node is selected. In this way, all check nodes and all corresponding bit nodes are selected in some sequences by process 1200. After all check nodes and corresponding bit nodes have been selected, process 1200 may continue to step 1232. At step 1232, the most likely of the candidate codewords (determined through successive iterations of step 1226) is selected. The most likely codeword may depend on the properties of channel 116. For example, if channel 116 is an additive white Gaussian noise (AWGN) channel, the codeword selected as the most likely codeword may be the codeword closest in the least-squares sense to received codeword 122. Process 1200 may output the most likely codeword at step 1234. For example, the most likely codeword may be output as user information estimate 128 and/or may be passed to an application or to sink 130. Process 1200 may then terminate at step 1212.

Thus, in this embodiment, the LDPC decoder and post-processor are configured to terminate decoding after all valid codewords (candidate codewords) are identified. Alternatively, process 1200 can easily be modified to the terminate once a certain number of valid codewords have been identified. Further, the number required for termination may be fixed or variable. The number required for termination may be dependent on, for example, the syndrome weight associated with the tentative codeword.

Figure 13:
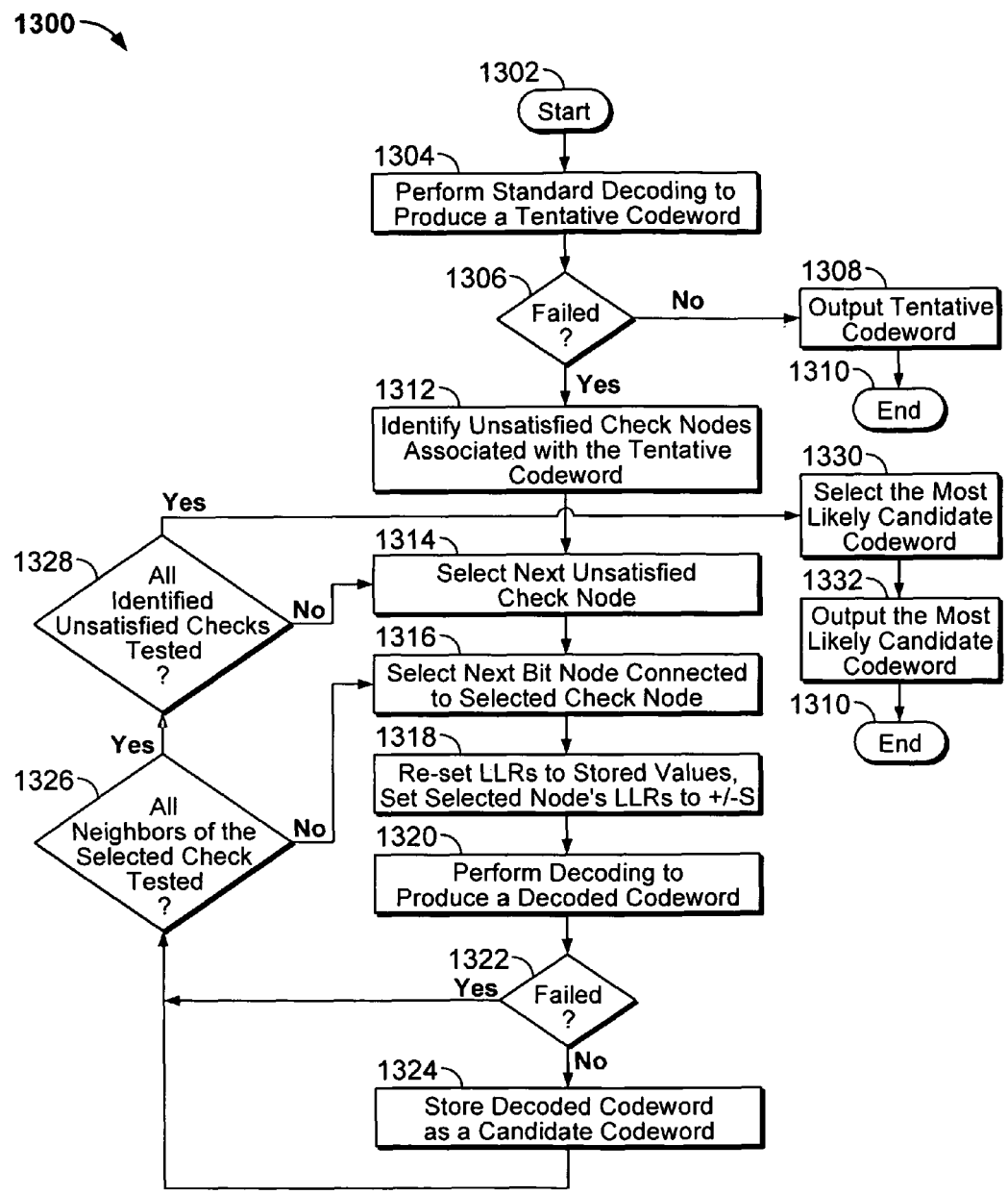

Referring to FIG. 13, process 1300 is shown for decoding a received LDPC codeword, where the LDPC post-processor performs correction using LDPC decoder re-set. When standard decoding of received codeword 122 does not produce a valid codeword, process 1300 may be used to generate more than one candidate codeword from which the most likely codeword may be selected as the output codeword.

Process 1300 starts at step 1302. At step 1304, the LDPC decoder performs standard decoding on received codeword 122 to produce a tentative codeword. For example, the LDPC decoder may operate in a similar or identical manner as described in step 1004 (FIG. 10). The LLRs associated with the tentative codeword may be stored in step 1304. For example, the LLRs may be stored in selected bits memory 650. At step 1306, the LDPC decoder or post-processor determines whether the standard decoding failed. If, at step 1306, the LDPC decoder or post-processor determines that standard decoding did not fail, the LDPC post-processor may output the tentative codeword (or the corresponding user information estimate) at step 1308. Process 1300 then ends at step 1310. If, at step 1306, the LDPC decoder or post-processor instead determines that standard decoding failed, process 1300 may continue to step 1312. At step 1312, the LDPC post-processor may identify the unsatisfied check nodes associated with the tentative codeword. Then, at step 1314, the LDPC post-processor may select the next unsatisfied check node. For example, the LDPC post-processor may choose the next unsatisfied check node using a process similar or identical to that described in step 1012 (FIG. 10). The LDPC post-processor may then, at step 1316, select the next bit node connected to the selected check node. Process 1300 may continue to step 1318. At this step, the LDPC post-processor may re-set the LLRS not contained in the set of selected the bit and/or check nodes to the values stored, for example, during step 1304. For example, the LDPC post-processor may set the LLRs for bit nodes in the set of selected nodes to +S or −S, where +S and −S are maximum and minimum values of the LLR, respectively, and are described, for example, in step 1016 (FIG. 10).

At step 1320, the LDPC decoder may perform LDPC decoding to produce a decoded codeword. For example, the LDPC decoder may perform LDPC decoding similarly or identically to the manner described in step 1020 (FIG. 10). Process 1300 may then continue at step 1322, in which LDPC decoder or post-processor determines whether the decoding failed. If the decoding at step 1322 does not fail, process 1300 may continue to step 1324, where the LDPC decoder stores the decoded codeword as a candidate codeword. For example, the decoded codeword may be stored in selected bits memory 650. Process 1300 may continue at step 1326 from either step 1322 (if decoding failed) or step 1324 (if decoding did not fail). At step 1326, process 1300 may determine if all bit node neighbors of the check node determined in step 1314 have been tested. If not all neighbors have been tested, process 1300 may return to step 1316 and a next bit node connected to the current check node may be selected. If all neighbors have been tested, process 1300 continues to step 1328 where process 1300 determines of all check nodes have been tested. If all check nodes have not been tested, process 1300 returns to step 1314 and the next check node may be selected. After all check nodes and corresponding bit nodes have been tested by step 1322, process 1300 may continue to step 1330. At this step, the most likely of the candidate codewords (which may be stored in various iterations of step 1324) is selected. Process 1300 may output the most likely codeword at step 1332. For example, the most likely codeword May be output as user information estimate 128 and passed to an application or to sink 130.

Thus, in this embodiment, the LDPC decoder and post-processor are configured to terminate decoding once all valid codewords are identified. Process 1300 can easily be modified to the case where the LDPC decoder and post-processor terminate after a number of valid codewords are decoded. Further, the number of codewords may depend on system parameters such as the syndrome weight of received codeword 122.

Figure 14:
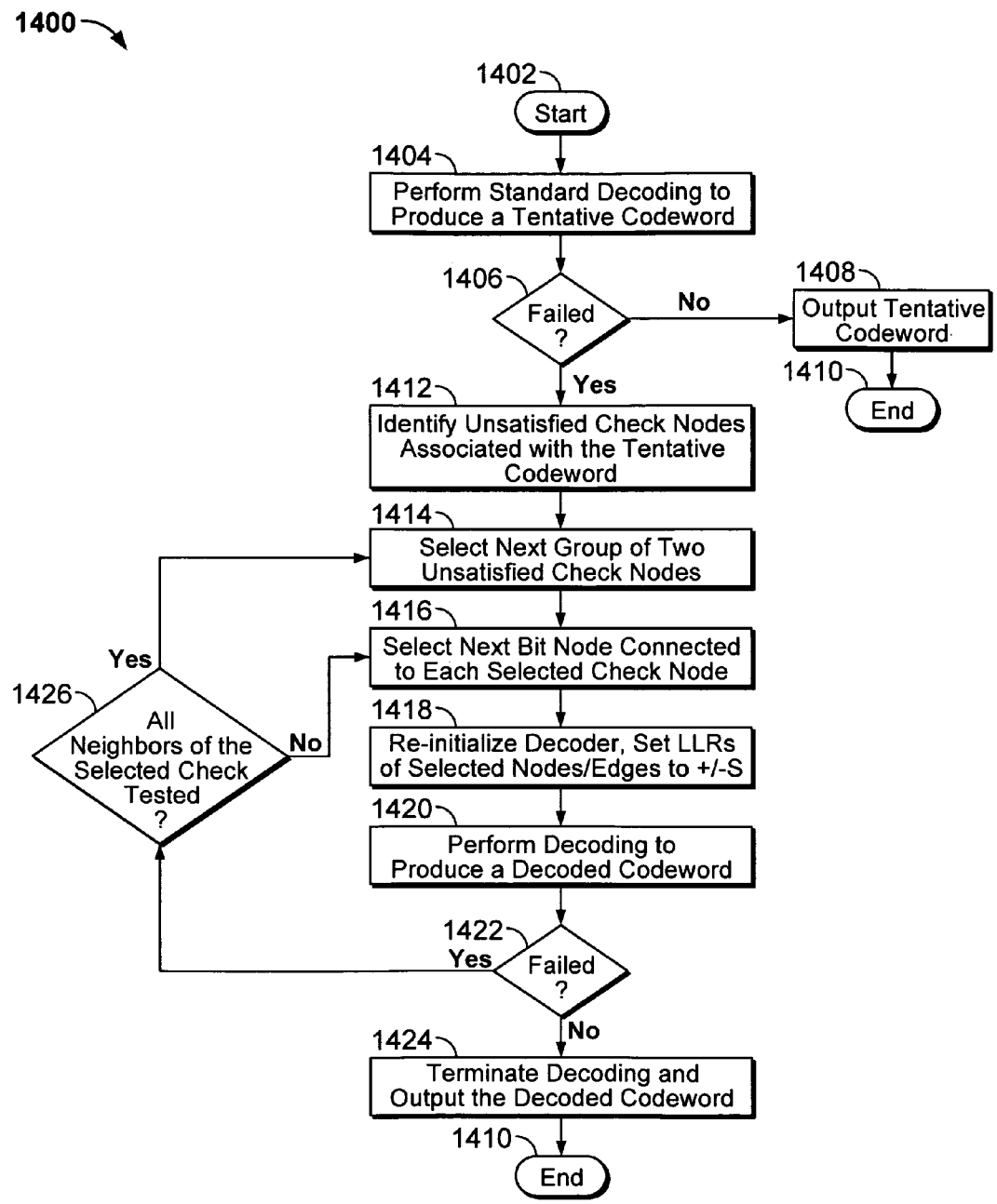
FIG. 14 is a flowchart of an illustrative process for decoding a received codeword with post-processing using two bit nodes.

Referring to FIG. 14, process 1400 is shown for decoding a received LDPC codeword, where the LDPC post-processor performs correction on two check/bit nodes with LDPC decoder re-initialization. Process 1400 may perform correction on two unsatisfied check nodes at a time. This feature may be desirable, for example, when decoding a single unsatisfied check node at a time does not yield a valid codeword. Performing correction on two unsatisfied check nodes at a time may consume additional hardware resources compared to the process described in FIGS. 10-13. The method below is only illustrative and may be readily extended to the case of correcting N unsatisfied check nodes at a time where N is any positive integer greater than 2. In general, the complexity of the decoding algorithm may increase exponentially in N.

Process 1400 starts at step 1402. At step 1404, the LDPC decoder performs standard decoding on received codeword 122 to produce a tentative codeword. For example, the LDPC decoder may operate in a similar or identical manner as described in step 1004 (FIG. 10). The LLRs associated with the tentative codeword may be stored during step 1404. For example, the LLRs may be stored in selected bits memory 650. At step 1406, the LDPC decoder or post-processor determines whether the standard decoding failed. If, at step 1406, the LDPC decoder or post-processor determines that standard decoding did not fail, the LDPC post-processor may output the tentative codeword (or the corresponding user information estimate) at step 1408. Process 1400 then ends at step 1410. If, at step 1406, the LDPC decoder or post-processor instead determines that standard decoding failed, process 1400 may continue to step 1412. At step 1412, the LDPC post-processor may identify the unsatisfied check nodes associated with the tentative codeword. For example the unsatisfied check nodes may be identified by calculating the syndrome of received codeword 122. Then, at step 1414, the LDPC post-processor may select the next group of two unsatisfied check nodes. For example, when step 1414 is run for the first time, the next group of two unsatisfied check nodes may be the left-most two unsatisfied check nodes in a Tanner graph representation of the LDPC code. The LDPC post-processor may then, at step 1416, select a next bit node connected to each of the selected check nodes.

Process 1400 may continue to step 1418. At this step, the LDPC post-processor may re-initialize the LDPC decoder similarly or identically to the steps described in step 1018 (FIG. 10). For example, the LDPC post-processor may set the node LLRs for selected bit nodes to +S or −S. The LDPC post-processor may change the appropriate edge LLRs to +S or −S, and may request that the LDPC decoder set all remaining edge LLRs to zero.

At step 1420, the LDPC decoder may perform LDPC decoding to produce a decoded codeword. For example, the LDPC decoder may perform LDPC decoding similarly or identically to the manner described in step 1020 (FIG. 10). Process 1400 may then continue at step 1422, in which LDPC decoder or post-processor determines whether the decoding failed. If the decoding at step 1422 does not fail, process 1400 may terminate the decoding and output the decoded codeword at step 1424 and end process 1400 at step 1410. If the decoding at step 1422 fails, process 1400 may continue to step 1426. At this step, it is determined if all the bit node neighbors of the unsatisfied check nodes selected in step 1414 have been tested. If not, process 1400 returns to step 1416, and the LDPC post-processor selects the next pair of bit nodes connected to two selected unsatisfied check nodes. If instead, at step 1426, the LDPC post-processor determines that all bit node pairs corresponding to the selected checks have been tested, process 1400 returns to step 1414 where the LDPC post-processor selects the next group of two unsatisfied check nodes to perform correction on. After all check nodes and corresponding bit nodes have been tested by step 1422, process 1400 may terminate the decoding process.

Thus, in this embodiment, the LDPC decoder and post-processor are configured to terminate decoding once a valid codeword is identified.

The foregoing describes systems, methods, and apparatus for post-processing received codeword 122 after standard decoding fails. Those skilled in the art will appreciate that the invention can be practiced by other than the described embodiments, which are presented for the purpose of illustration rather than of limitation.

What is claimed is:

1. A method of decoding a received codeword, the method comprising:
   performing standard decoding on the received codeword based on a low-density parity check (LDPC) code, wherein the standard decoding produces a plurality of checks and a tentative codeword;
   selecting a first unsatisfied check from the plurality of checks;
   identifying a first set of symbol positions in the received codeword associated with the first unsatisfied check;
   modifying the received codeword; wherein the modifying comprises:
      selecting a first symbol position from the first set of symbol positions;
      setting the first symbol position to a sign opposite of that of a corresponding symbol position in the tentative codeword; and
      setting a remainder of the first set of identified symbol positions to a same sign as that of corresponding symbol positions in the tentative codeword; and
   decoding the modified received codeword based on the LDPC code.

2. The method of claim 1, the method further comprising:
   modifying the received codeword to produce a second modified received codeword, wherein the second modified received codeword is produced by:
   selecting a second symbol position from the first set of identified symbol positions,
   setting the second symbol position of the received codeword to a sign opposite of that of a corresponding symbol position in the tentative codeword, and
   setting others of the first set of identified symbol positions to a same sign as that of corresponding symbol positions in the tentative codeword; and
   decoding the second modified received codeword based on the LDPC code.

3. The method of claim 1, the method further comprising:
   selecting a second unsatisfied check from the plurality of checks;
   identifying a second set of symbol positions in the received codeword associated with the second unsatisfied check;
   modifying the received codeword to produce a second modified received codeword, wherein the second modified received codeword is produced by setting the second set of identified symbol positions of the received codeword to predetermined values; and
   decoding the second modified received codeword based on the LDPC code.

4. The method of claim 1, the method further comprising:
   selecting a second unsatisfied check from the plurality of checks;
   identifying a second set of symbol positions in the received codeword associated with the second unsatisfied check,
   wherein modifying the received codeword comprises setting the first and second set of identified symbol positions of the received codeword to predetermined values.

5. A method of decoding a received codeword using a low-density parity check (LDPC) code, the method comprising:
   performing, on the received codeword, one or more iterations of an iterative decoding algorithm, wherein a plurality of messages are generated at each iteration and used in a next iteration, and wherein the one or more iterations produce a plurality of checks;
   selecting a first unsatisfied check from the plurality of checks;

identifying a first set of symbol positions in the received codeword associated with the first unsatisfied check; and performing, on the received codeword, a plurality of additional iterations of the iterative decoding algorithm, wherein the plurality of messages that are associated with the first set of identified symbol positions are fixed to predetermined values in each of the additional iterations.

6. The method of claim 5, wherein each message that is associated with the first set of identified symbol positions corresponds to a log-likelihood ratio value of a predetermined magnitude.

7. The method of claim 5, wherein:
the one or more iterations produce a tentative codeword; and
the plurality of messages in each of the additional iterations are fixed by:
selecting a first symbol position from the first set of identified symbol positions;
fixing a sign of a message associated with the first symbol position to a sign opposite of that of a corresponding symbol position in the tentative codeword; and
fixing signs of messages associated with a remainder of the first set of identified symbol positions to same signs as that of corresponding symbol positions in the tentative codeword.

8. The method of claim 7, further comprising:
performing, on the received codeword, a plurality of further additional iterations of the iterative decoding algorithm, wherein messages at each of the further additional iterations are fixed by:
selecting a second symbol position from the first set of identified symbol positions,
fixing a sign of a message associated with the second symbol position to a sign opposite of that of a corresponding symbol position in the tentative codeword; and
fixing signs of the messages associated with others of the first set of identified symbol positions to same signs as that of corresponding symbol positions in the tentative codeword.

9. The method of claim 5, the method further comprising:
selecting a second unsatisfied check from the plurality of checks;
identifying a second set of symbol positions in the received codeword associated with the second unsatisfied check;
performing, on the received codeword, one or more further additional iterations of the iterative decoding algorithm, wherein the messages that are associated with the second set of identified symbol positions are fixed to predetermined values in each of the further additional iterations.

10. The method of claim 5, the method further comprising:
selecting a second unsatisfied check from the plurality of checks;
identifying a second set of symbol positions in the received codeword associated with the second unsatisfied check,
wherein the messages that are associated with the first and second set of identified symbol positions are fixed to predetermined values in each of the additional iterations.

11. A system for decoding a received codeword based on a low-density parity check (LDPC) code, the system comprising:
an LDPC decoder coupled to a channel detector, the LDPC decoder configured to:
obtain as inputs from the channel detector symbols of the received codeword; and
perform standard decoding on the received codeword, wherein the standard decoding produces a plurality of checks and a tentative codeword, each check in the plurality storing a corresponding message; and
an LDPC post-processor configured to:
select a first unsatisfied check from the plurality of checks;
identify a first set of symbol positions in the received codeword associated with the first unsatisfied check, each symbol position in the first set storing a corresponding message;
modify a portion of the inputs to the LDPC decoder based on the messages corresponding to the first set of symbol positions by:
selecting a first symbol position from the first set of symbol positions; and
setting the message corresponding to the first symbol position to a sign opposite of that of a corresponding symbol position in the tentative codeword; and
direct the LDPC decoder to perform decoding on the received codeword with modified inputs.

12. The system of claim 11, wherein the LDPC post-processor sets messages corresponding to the first set of symbol positions to a log-likelihood ratio of a predetermined value.

13. The system of claim 11, wherein the LDPC post-processor further modifies the portion of inputs by:
setting the messages corresponding to a remainder of the first set of symbol positions to a same sign as that of corresponding symbol positions in the tentative codeword.

14. The system of claim 13, wherein the LDPC post-processor performs another modification to another portion of the inputs by:
selecting a second symbol position from the first set of identified symbol positions;
creating a modified received codeword by:
setting a message corresponding to the second symbol position of the received codeword to a sign opposite of that of a corresponding symbol position in the tentative codeword; and
setting messages corresponding to others of the first set of identified symbol positions to a same sign as that of corresponding symbol positions in the tentative codeword; and
decoding the modified received codeword based on the LDPC code.

15. The system of claim 11, the LDPC post-processor further configured to:
select a second unsatisfied check from the plurality of checks;
identify a second set of symbol positions in the received codeword associated with the second unsatisfied check, each symbol position in the second set storing a corresponding message separate from the messages associated with the first set of symbol positions;
modify a portion of the inputs to the LDPC decoder based on the messages corresponding to the second set of symbol positions; and
direct the LDPC decoder to perform decoding on the received codeword with inputs modified by the messages corresponding to the second set of symbol positions.

16. The system of claim 11, the LDPC post-processor further configured to:
select a second unsatisfied check from the plurality of checks;

identify a second set of symbol positions in the received codeword associated with the second unsatisfied check; and modify the received codeword by setting the first and second set of identified symbol positions of the received codeword to predetermined values.

17. The system of claim 11, wherein the LDPC post-processor further determines a set of unsatisfied checks from the plurality of checks by matrix multiplying a parity check matrix corresponding to the LDPC code by the received codeword.

18. The system of claim 11, wherein the LDPC post-processor selects the first unsatisfied check from the plurality of checks based on values K and s, wherein K is a number of symbols and s is a number of unsatisfied checks.

19. The system of claim 11, wherein a channel detector operates based on a soft-output Viterbi algorithm (SOVA).

20. The system of claim 11, wherein performing standard decoding comprises:
performing one or more iterations of an iterative message passing algorithm, wherein a plurality of messages are generated at each of the iterations.

21. The system of claim 20, wherein the LDPC decoder is further configured to:
re-initialize the messages prior to performing decoding on the received codeword with modified inputs.

22. The system of claim 20, wherein the LDPC decoder is further configured to:
use the messages generated after the one or more iterations as an initial set of messages when performing the decoding on the received codeword with modified inputs.

23. A system for decoding a received codeword based on a low-density parity check (LDPC) code, the system comprising:
an LDPC decoder configured to:
perform, on the received codeword, one or more iterations of an iterative decoding algorithm, wherein a plurality of messages are generated at each iteration and used in a next iteration, and wherein the one or more iterations produce a plurality of checks;
an LDPC post-processor configured to:
select a first unsatisfied check from the plurality of checks;
identify a first set of symbol positions in the received codeword associated with the first unsatisfied check; and
direct the LDPC decoder to perform, on the received codeword, a plurality of additional iterations of the iterative decoding algorithm, wherein the LDPC post-processor fixes the messages that are associated with the first set of identified symbol positions to predetermined values in each of the additional iterations.

24. The system of claim 23, wherein the LDPC decoder is further configured to produce a tentative codeword based on the one or more iterations; and the LDPC post-processor is further configured to fix the plurality of generated messages by:
selecting a first symbol position from the first set of identified symbol positions;
fixing a sign of a message associated with the first symbol position to a sign opposite of that of a corresponding symbol position in the tentative codeword; and
fixing signs of messages associated with a remainder of the first set of identified symbol positions to the same signs as that of corresponding symbol positions in the tentative codeword.

25. The system of claim 24, wherein the LDPC decoder is further configured to perform, on the received codeword, one or more further additional iterations of the iterative decoding algorithm, and wherein the LDPC post-processor is further configured to fix the messages at each of the one or more further additional iterations by:
selecting a second symbol position from the first set of identified symbol positions;
fixing a sign of the message associated with the second symbol position to a sign opposite of that of a corresponding symbol position in the tentative codeword; and
fixing signs of the messages associated with others of the first set of identified symbol positions to the same signs as that of corresponding symbol positions in the tentative codeword.

26. The system of claim 23, the LDPC post-processor further configured to:
select a second unsatisfied check from the plurality of checks;
identify a second set of symbol positions in the received codeword associated with the second unsatisfied check; and
perform, on the received codeword, one or more further additional iterations of the iterative decoding algorithm, wherein the messages that are associated with the second set of identified symbol positions are fixed to predetermined values in each of the further additional iterations.

27. The system of claim 23, wherein the LDPC post-processor is further configured to:
select a second unsatisfied check from the plurality of checks; and
identify a second set of symbol positions in the received codeword associated with the second unsatisfied check, wherein the messages that are associated with the first and second set of identified symbol positions are fixed to predetermined values in each of the additional iterations.

28. Apparatus for decoding a received codeword, the apparatus comprising:
means for performing standard decoding on the received codeword based on a low-density parity check (LDPC) code, wherein the standard decoding produces a plurality of checks and a tentative codeword;
means for selecting a first unsatisfied check from the plurality of checks;
means for identifying a first set of symbol positions in the received codeword associated with the first unsatisfied check;
means for modifying the received codeword, wherein the modifying comprises:
selecting a first symbol position from the first set of symbol positions;
setting the first symbol position to a sign opposite of that of a corresponding symbol position in the tentative codeword; and
setting a remainder of the first set of symbol positions to a same sign as that of corresponding symbol positions in the tentative codeword;
means for decoding the modified received codeword based on the LDPC code.

29. Apparatus for decoding a received codeword using a low-density parity check (LDPC) code, the apparatus comprising:
means for performing, on the received codeword, one or more iterations of an iterative decoding algorithm, wherein a plurality of messages are generated at each iteration and used in a next iteration, and wherein the one or more iterations produce a plurality of checks;
means for selecting a first unsatisfied check from the plurality of checks;
means for identifying a first set of symbol positions in the received codeword associated with the first unsatisfied check; and
means for performing, on the received codeword, a plurality of additional iterations of the iterative decoding algorithm, wherein messages that are associated with the first set of identified symbol positions are fixed to predetermined values in each of the additional iterations.

* * * * *